United States Patent [19]

Uda et al.

[11] Patent Number: 5,049,972
[45] Date of Patent: Sep. 17, 1991

[54] METHOD OF MANUFACTURING SEMICONDUCTOR INTEGRATED CIRCUIT DEVICE

[75] Inventors: Takayuki Uda; Tasuku Tanaka, both of Ohme; Yoshiaki Emoto, Higashiyamato; Shigeo Kuroda, Ohme, all of Japan

[73] Assignee: Hitachi, Ltd., Tokyo, Japan

[21] Appl. No.: 544,064

[22] Filed: Jun. 26, 1990

Related U.S. Application Data

[63] Continuation of Ser. No. 299,540, Jan. 18, 1989, abandoned.

[30] Foreign Application Priority Data

| Jan. 29, 1988 | [JP] | Japan | 63-19804 |
| Jan. 29, 1988 | [JP] | Japan | 63-19805 |
| Jan. 29, 1988 | [JP] | Japan | 63-19806 |
| Jan. 29, 1988 | [JP] | Japan | 63-19807 |

[51] Int. Cl.$^5$ ............... H01L 23/48; H01L 27/02; H01L 27/10
[52] U.S. Cl. ............... 357/68; 357/65; 357/40; 357/45
[58] Field of Search ............... 357/65, 68, 40, 45

[56] References Cited

U.S. PATENT DOCUMENTS

| 4,315,984 | 2/1982 | Okazaki et al. | 437/944 |
| 4,468,411 | 8/1984 | Sloan et al. | 437/229 |
| 4,532,002 | 7/1985 | White | 437/187 |
| 4,560,435 | 12/1985 | Brow et al. | 156/661.1 |
| 4,757,033 | 7/1988 | Ebata | 437/944 |

FOREIGN PATENT DOCUMENTS

| 0027391 | 3/1977 | Japan | 437/187 |
| 0035475 | 4/1978 | Japan | 437/229 |
| 0181143 | 11/1982 | Japan | 437/944 |

*Primary Examiner*—Mark Prenty
*Attorney, Agent, or Firm*—Antonelli, Terry, Stout & Kraus

[57] ABSTRACT

A method of manufacturing a semiconductor integrated circuit device wherein a conductor film is formed on a front surface of a substrate by a lift-off technique; comprising forming a first resist film on that area of the substrate surface on which the conductor film is not formed, forming a second resist film on the whole substrate surface including the first resist film and a conductor film forming area of the substrate surface, providing a first opening for forming the conductor film in a conductor film forming area of the second resist film and also providing a second opening for forming a dummy conductor film in that area of the second resist film in which the conductor film is not formed, depositing the conductor film on the whole substrate surface including the substrate surface inside the first opening, the first resist film inside the second opening and the second resist film, and removing the second resist film and the first resist film respectively, so as to leave the conductor film inside the first opening and to remove the conductor film on the second resist film and the dummy conductor film on the first resist film.

16 Claims, 16 Drawing Sheets

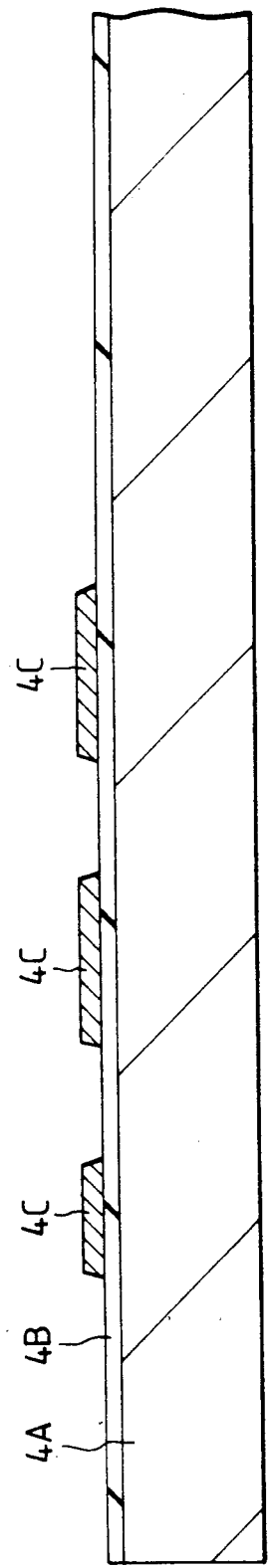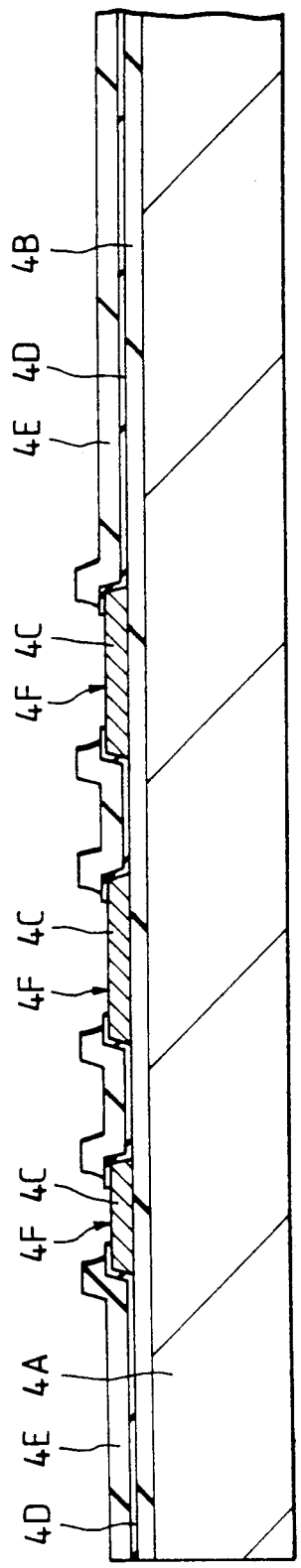

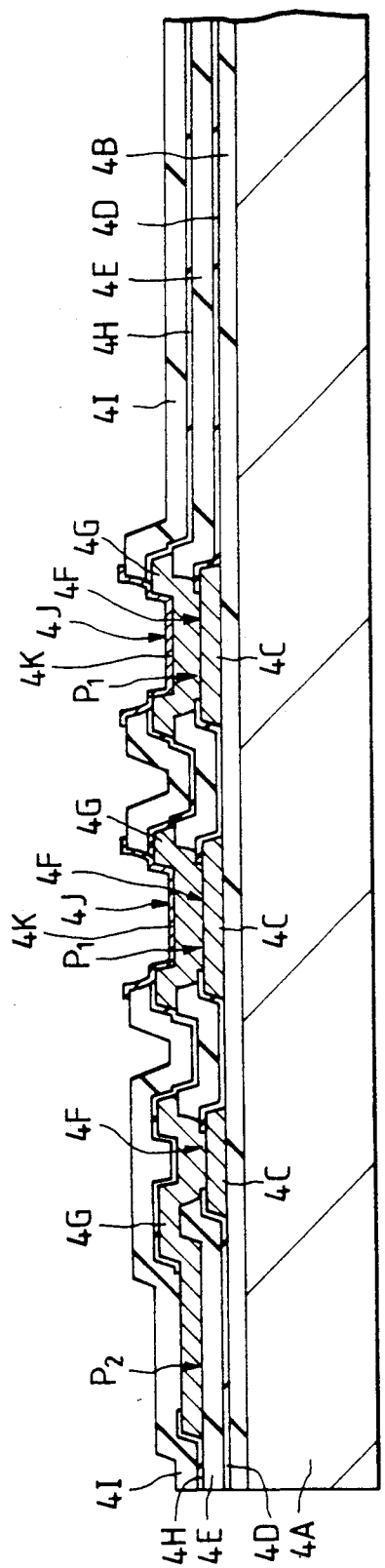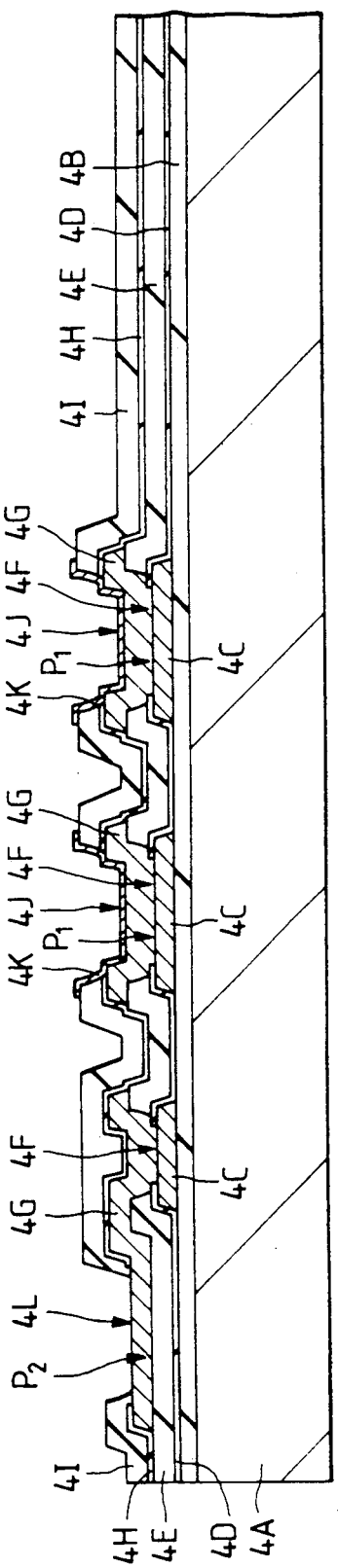

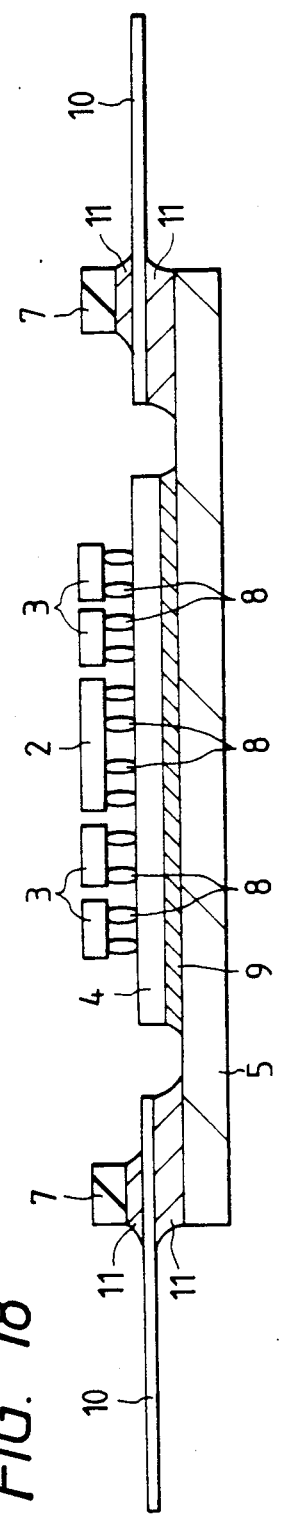
FIG. 17
FIG. 18
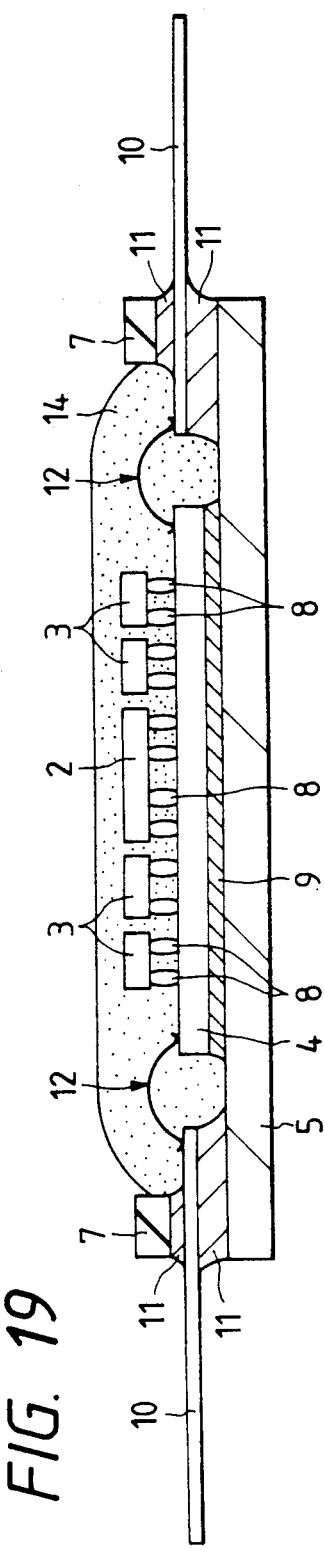
FIG. 19

5,049,972

METHOD OF MANUFACTURING SEMICONDUCTOR INTEGRATED CIRCUIT DEVICE

This application is a continuation of application Ser. No. 299,540, filed on Jan. 18, 1989 and now abandoned.

BACKGROUND OF THE INVENTION

The present invention relates to semiconductor integrated circuit devices, and more particularly to techniques which are effective when applied to a semiconductor integrated circuit device having a conductor film on a substrate.

A semiconductor integrated circuit device which the inventor is developing, is so constructed that a mother chip on which a plurality of semiconductor chips are mounted is encapsulated by a base board and a sealing cap. This semiconductor integrated circuit device is used as, for example, a RAM module in which the plurality of semiconductor chips each having a built-in RAM (Random Access Memory) are mounted on the mother chip.

Each of the semiconductor ships is mounted on the mother chip by so-called face-down bonding (Controlled Collapse Bonding) wherein bump electrodes are interposed. One end side of the bump electrode is connected to the external terminal (bonding pad) of the semiconductor ship, while the other end side thereof is connected to the terminal of the mother chip. The bump electrodes are formed of a solder which is evaporated by the use of a metal mask.

Incidentally, the semiconductor integrated circuit device of this type is described in, for example, "Nikkei Electronics" dated Sept. 24, 1984, pp. 265–294, published by Nikkei McGraw-Hill Inc. In addition, the formation of bump electrodes by the use of a metal mask is described in "VLSI" TECHNOLOGY," pp. 564–570, published by McGraw-Hill Inc.

Upon studying the subject that the bump electrodes for connecting the semiconductor chip and the mother chip are formed by a lift-off technique, the inventor is making basic researches thereon. The bump electrodes formed by the lift-off technique can be finished up more precisely as compared with the bump electrodes formed using the metal mask. In other words, the lift-off technique has the feature that the bump electrodes are formed at a higher density, so the density of integration of the semiconductor integrated circuit device can be raised.

The manufacturing technique which the inventor is developing, is as follows:

First, the whole front surface of the mother chip including the terminals thereof is coated with a photoresist film. After the photoresist film has been baked, its parts on the terminals of the mother chip are removed by development so as to form openings.

Subsequently, the solder is evaporated on the photoresist film and on the terminals lying inside the openings.

Next, the photoresist film is stripped off by a peeling solution so as to leave the solder inside the openings, thereby to form the bump electrodes and to remove the solder lying on the photoresist film. Thus, the bump electrodes are formed by the lift-off technique employing the photoresist film.

SUMMARY OF THE INVENTION

As the result of the inventor's basic researches, in an area where the bump electrodes existed densely, the peeling solution was easy to permeate into the photoresist film through the openings during the process of lift-off, and the photoresist film could be favorably stripped off. However, in an area where the bump electrodes did not exist or existed sparsely, the inferior stripping of the photoresist film occurred frequently. The inventor's analysis has revealed that, in a case where the bump electrodes do not exist over, at least, about 1 [mm$^2$], the peeling solution does not reliably permeate into the photoresist film, so the inferior stripping of the photoresist film arises. This inferior stripping of the photoresist film arose, not only in the case of forming the bump electrodes on the mother chip side, but similarly in case of forming them on the semiconductor ship side. Especially in the semiconductor chip which had a built-in DRAM (Dynamic RAM) or SRAM (Static RAM), a memory cell array which occupied the greater part of the area of the chip was not provided with the bump electrodes in order that soft errors might not be developed by alpha particles appearing from radioactive elements (U and Th) contained in slight amounts in the solder, and the inferior stripping of the photoresist film often occurred in the area of the memory cell array. Likewise, in the semiconductor chip of the mixed type in which bipolar transistors and complementary MISFETs coexisted, the area of the complementary MISFETs was not provided with the bump electrodes because the threshold voltages of the complementary MISFETs fluctuated due to the alpha particles appearing from the radioactive elements, and the inferior stripping of the photoresist film often occurred in this area.

An object of the present invention is to provide, in a semiconductor integrated circuit device wherein a semiconductor chip having a memory function is formed with bump electrodes by a lift-off technique, a technique capable of enhancing the stripping property of a resist film in an area where no bump electrode is formed or an area where the bump electrodes are sparse.

Another object of the present invention is to provide a technique capable of achieving the aforementioned object and also reducing soft errors which are ascribable to alpha particles appearing from radioactive elements contained in slight amounts in the bump electrodes.

Another object of the present invention is to provide a technique capable of decreasing the number of manufacturing steps for achieving the aforementioned objects.

A further object of the present invention is to provide, in a semiconductor integrated circuit device wherein wiring principally made of Cu is formed on the front surface of a wiring board, a technique capable of forming the wiring by a lift-off technique and enhancing the stripping property of a resist film during the process of lift-off in an area where no wiring is formed or an area where the wiring is sparse.

Another object of the present invention is to provide a technique capable of decreasing the number of manufacturing steps for achieving the preceding object.

The above and other objects and novel features of the present invention will become apparent from the description of this specification and the accompanying drawings.

Typical aspects of performance of the present invention are briefly summarized as follows:

A method of manufacturing a semiconductor integrated circuit device wherein a conductor film is formed on a front surface of a substrate by a lift-off technique; comprises forming a first resist film on that area of the substrate surface on which the conductor film is not formed, forming a second resist film on the whole substrate surface including said first resist film and a conductor film forming area of the substrate surface, providing a first opening for forming the conductor film in a conductor film forming area of said second resist film and also providing a second opening for forming a dummy conductor film in that area of said second resist film in which said conductor film is not formed, depositing the conductor film on the whole substrate surface including the substrate surface inside said first opening, said first resist film inside said second opening and said second resist film, and removing said second resist film and said first resist film respectively, so as to leave said conductor film inside said first opening and to remove said conductor film on said second resist film and said dummy conductor film on said first resist film.

Besides, in addition to the above expedient, both said first resist film and said second resist film are formed of an identical material, and they are removed by an identical step after the deposition of the conductor film.

Further, a method of manufacturing a semiconductor integrated circuit device wherein a semiconductor chip with a memory function, including a memory circuit portion and a peripheral circuit portion is formed with a bump electrode by a lift-off technique on a front surface of its area for forming the peripheral circuit portion; comprises forming an alpha particle-intercepting film on a front surface of an area of said semiconductor chip for forming said memory circuit portion, forming a first resist film on said alpha particle-intercepting film, forming a second resist film on the whole surface of said semiconductor ship including said first resist film and the peripheral circuit portion-forming area, providing a first opening for forming said bump electrode in a peripheral circuit portion-forming area of said second resist film and also providing a second opening for forming a dummy bump electrode in a memory circuit portion-forming area of said second resist film, depositing a metal film for forming said bump electrode on the whole surface of said semiconductor chip including the semiconductor chip surface inside said first opening, said first resist film inside said second opening and said second resist film, and removing said second resist film and said first resist film respectively, so as to leave said metal film inside said first opening and form said bump electrode and to remove said metal film on said second resist film and said summy bump electrode on said first resist film.

According to the expedient described above, the second opening for forming the dummy bump electrode is provided in the memory circuit portion-forming area, and a peeling solution is positively caused to permeate into the second resist film through the second opening. It is therefore possible to enhance the stripping property of the second resist film in the memory circuit portion-forming area where the bump electrode is not formed.

In addition to the above functional effect, the first resist film can be removed by the step of removing the second resist film, so that the number of manufacturing steps can be decreased in correspondence with a process for stripping off the first resist film.

Moreover, alpha particles from the bump electrode can be intercepted by the alpha particle-intercepting film, so that soft errors ascribable to the alpha particles can be reduced.

Now, the construction of the present invention will be described in conjunction with embodiments.

Throughout the drawings for elucidating the embodiments, constituents having the same functions are denoted by identical symbols and shall not be repeatedly explained.

BRIEF DESCRIPTION OF THE DRAWINGS

FIGS. 6 thru 15 are sectional views of essential portions showing the mother chip and bump electrodes at the respective manufacturing steps thereof;

FIGS. 17 thru 20 are schematic sectional views showing the semiconductor integrated circuit device at the respective assembling steps thereof;

DESCRIPTION OF THE PREFERRED EMBODIMENTS

This embodiment is the first embodiment of the present invention in which the present invention is applied to an example wherein in a semiconductor integrated circuit device having a plurality of semiconductor chips mounted on a mother chip, bump electrodes are formed on the mother chip side.

Figure 1:
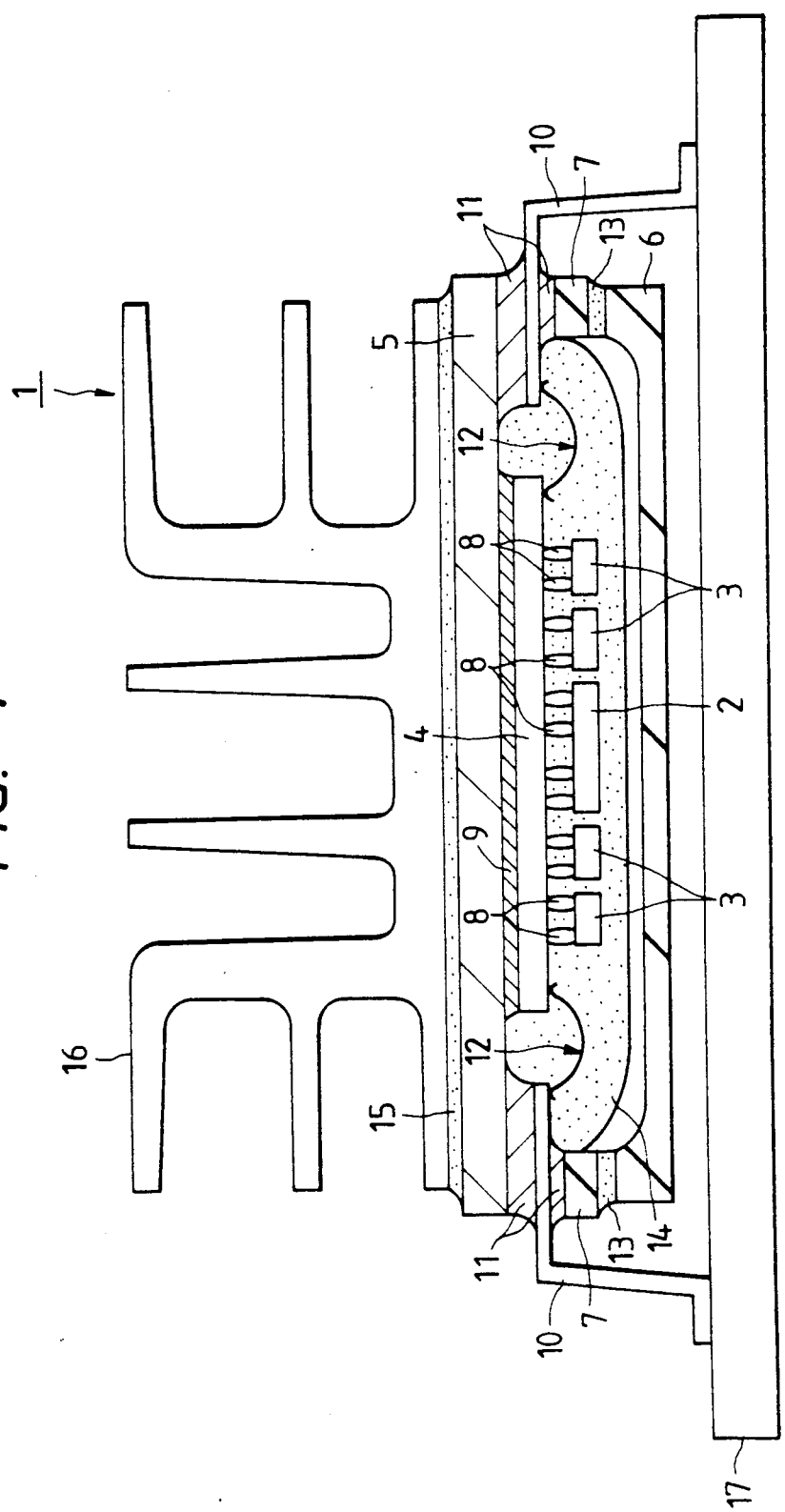
FIG. 1 is a schematic partly - sectional view showing the construction of a semiconductor integrated circuit device which is an embodiment of the present invention.

The construction of the semiconductor integrated circuit device which is the embodiment of the present invention is shown in FIG. 1 (a schematic partly-sectional view).

As shown in FIG. 1, the semiconductor integrated circuit device 1 is so constructed that a mother chip (mounting board) 4 on which a plurality of semiconductor chips 2 and 3 are respectively mounted is encapsulated by a base board 5, a frame 7 and a sealing cap 6.

Figure 2:
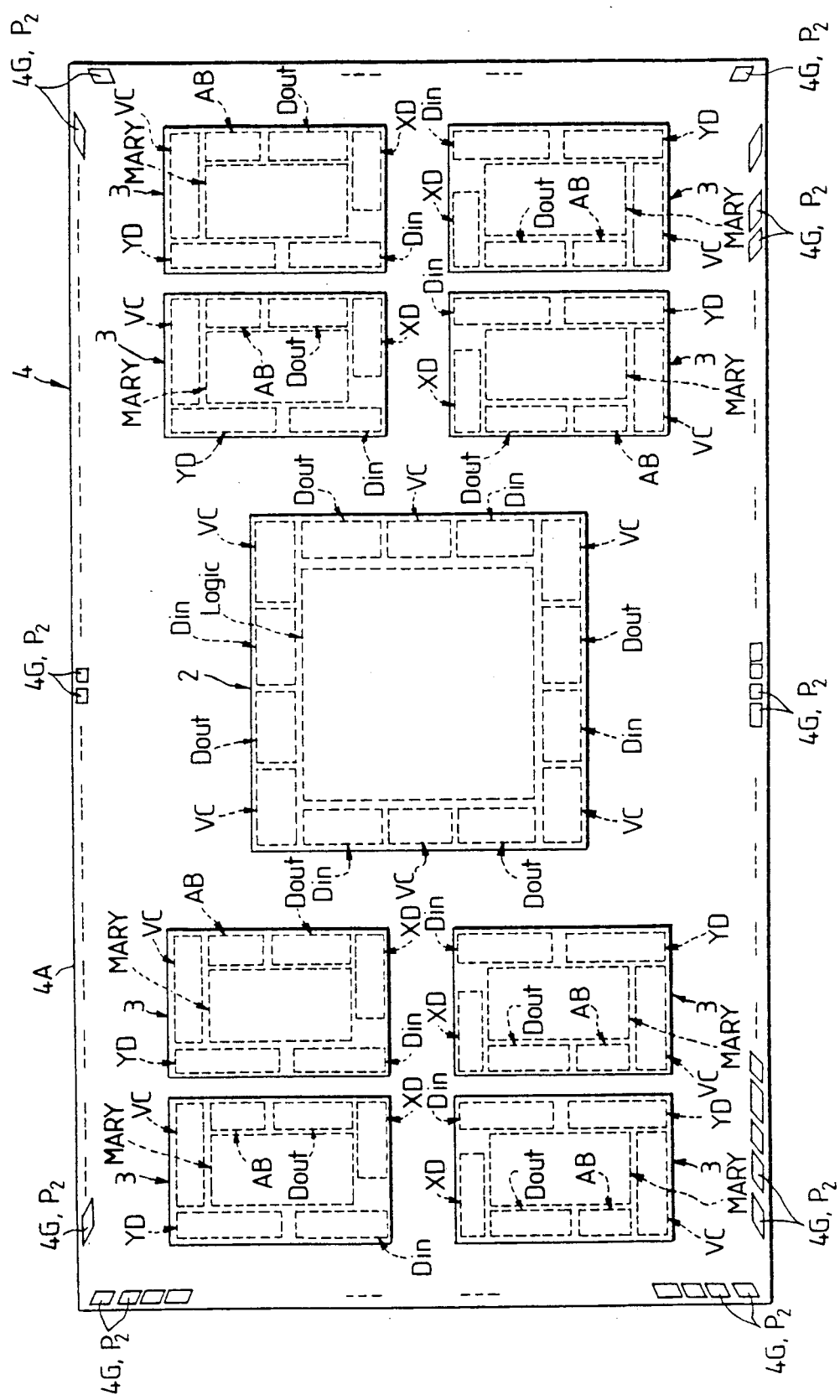
FIG. 2 is a plan view of a mother chip in the semiconductor integrated circuit device.

Each of the semiconductor chips 2 and 3 is mounted on the mother chip 4 through bump electrodes 8. That is, each of the semiconductor chips 2 and 3 is mounted on the mother chip 4 by face-down bonding (or CCB). As shown in FIG. 2 (a plan view of the mother chip), the mother chip 4 carries thereon one semiconductor chip (logic LSI) 2 having a logic function and eight semiconductor chips (memory LSIs) 3 each having a memory function. Since the semiconductor element-forming surface of each of the semiconductor chips 2 and 3 is located so as to confront the mounting surface of the mother chip 4, the rear surface of each of the semiconductor chips 2 and 3 opposite to the semiconductor element-forming surface is seen in FIG. 2.

As shown in FIG. 2, the semiconductor chip (logic LSI) 2 has a logic circuit portion "Logic" arranged centrally. In the logic circuit portion Logic, basic cells each of which is configured of one or more semiconductor elements are regularly arrayed in the shape of a matrix. The basic cells and the semiconductor elements thereof are connected by a plurality of layers of wiring so as to construct predetermined logic circuits. That is, the semiconductor chip 2 realizes predetermined logic functions in conformity with a so-called gate array system. The semiconductor chip 2 of this embodiment is configured of three wiring layers, among which the first and second layers of wiring principally construct the predetermined circuits, and the third layer of wiring is principally used as power source wiring. The semiconductor elements constituting the basic cells of the logic circuit portion Logic are bipolar transistors.

In the peripheral part of the semiconductor chip 2, these are arranged peripheral circuits which consist of input circuits Din, output circuits Dout and power source circuits VC. As in the logic circuit portion Logic, semiconductor elements which constitute each of the input circuits Din, output circuits Dout and power source circuits VC are principally connected by the first layer and second layer of wiring. The semiconductor elements constituting the peripheral circuits are bipolar transistors likewise to those of the logic circuit portion Logic.

Figure 3:
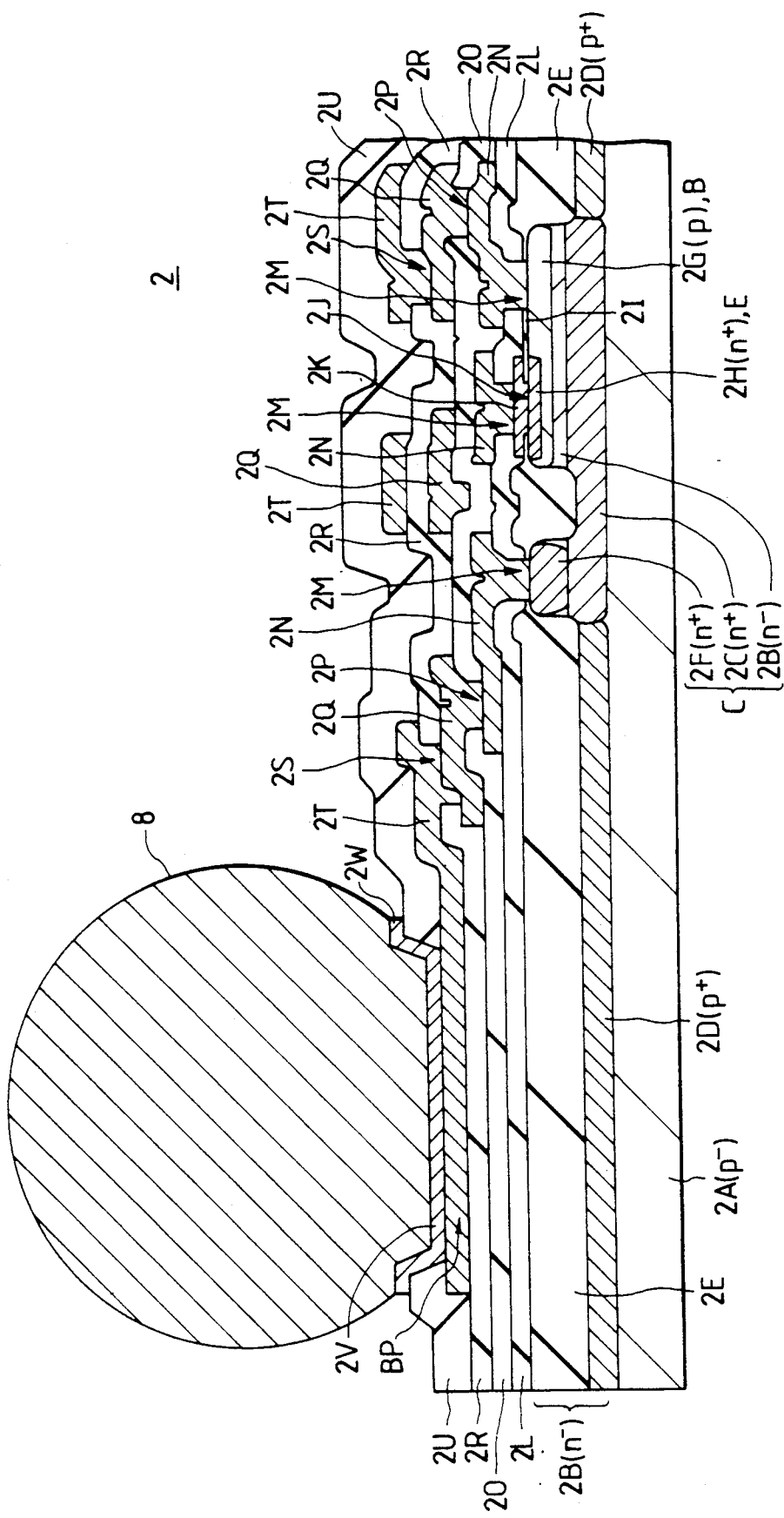
FIG. 3 is a sectional view of the essential portions of a semiconductor chip in the semiconductor integrated circuit device.

The concrete structure of the bipolar transistor which constitutes each of the logic circuit portion Logic and peripheral circuits of the semiconductor chip 2 is shown in FIG. 3 (a sectional view of essential portions).

As shown in FIG. 3, the bipolar transistor is constructed on the principal surface of a $p^-$-type semiconductor substrate 2A made of single-crystal silicon. The bipolar transistor is electrically isolated from the other regions by an isolation region which is made up of the semiconductor substrate 2A, a $p^+$-type semiconductor region 2D and an element isolating insulator film 2E. The semiconductor region 2D is formed between the semiconductor substrate 2A and an $n^-$-type epitaxial layer 2B which is grown on the front surface of the former. That is, the semiconductor region 2D is a buried semiconductor region. The element isolating insulator film 2E is formed on the principal surface of the epitaxial layer 2B so as to reach the semiconductor region 2D. This element isolating insulator film 2E is formed of a silicon oxide film which is produced by oxidizing the principal surface of the epitaxial layer 2B.

The bipolar transistor is constructed of the n-p-n type which is configured of an n-type collector region C, a p-type base region B and an n-type emitter region E.

The collector region C is made up of an $n^-$-type semiconductor region 2C, the epitaxial layer 2B and a potential pulling-up $n^+$-type semiconductor region 2F. Likewise to the semiconductor region 2D, the semiconductor region 2C is a buried semiconductor region which is interposed between the semiconductor substrate 2A and the epitaxial layer 2B. The semiconductor region 2F is provided in the principal surface part of the epitaxial layer 2B so as to reach the semiconductor region 2C. The first layer of wiring 2N is connected to the semiconductor region 2F of the collector region C through a contact hole 2M which is formed in an inter-layer insulator film 2L. The wiring 2N is formed of an aluminum film, or an aluminum film doped with Cu or/and Si. The element Cu relieves a stress migration. The element Si reduces the appearance of alloy spikes.

The base region B is made up of a p-type semiconductor region 2G which is provided in the principal surface part of the epitaxial layer 2B constituting the collector region C. The wiring 2N is connected to the semiconductor region 2G being the base region B.

The emitter region E is made up of an $n^+$-type semiconductor region 2H which is provided in the principal surface part of the semiconductor region 2G constructing the base region B. An emitter electrode 2K is connected to the semiconductor region 2H being the emitter region E through a contact hole 2J which is formed in an insulator film 2I. The emitter electrode 2K is formed of a polycrystalline silicon film into which an n-type impurity (P or As) is introduced. The semiconductor region 2H is defined in such a way that the n-type impurity introduced in the emitter electrode 2K is diffused into the semiconductor region 2G. Although no illustration is made, the polycrystalline silicon film forming the emitter electrode 2K constructs wiring, resistors etc. in the other regions. The wiring 2N is similarly connected to the emitter electrode 2K.

The first layer of wiring 2N is overlaid with the second layer of wiring 2Q with an inter-layer insulator film 2O interposed therebetween. Further, the second layer of wiring 2Q is overlaid with the third layer of wiring 2T with an inter-layer insulator film 2R interposed therebetween. As stated before, the semiconductor chip 2 is constructed of the three-layer wiring structure. The wiring 2N and the wiring 2Q are connected through contact holes 2P which are provided in the inter-layer insulator film 2O. The wiring 2Q and the wiring 2T are connected through contact holes 2S which are provided in the inter-layer insulator film 2R. Each of the wiring layers 2Q and 2T is formed of the same material as that of the wiring 2N. Each of the inter-layer insulator films 2L, 2O and 2R is mainly formed of a silicon oxide film.

The third layer of wiring 2T is overlaid with a passivation film 2U. The passivation film 2U is formed of a silicon nitride film which is deposited by, for example, plasma CVD.

The third layer of wiring 2T constructs an external terminal (bonding pad) BP on each of the peripheral circuits or on the part of the logic circuit portion Logic led out of each of the peripheral circuits. As illustrated in FIG. 3, an opening 2V is formed in the passivation film 2U on the part of the wiring 2T serving as the external terminal BP. The part of the wiring 2T being the external terminal BP is overlaid with a barrier metal layer 2W through the opening 2V. The barrier metal layer 2W is made up of a composite film in which Cr, Cu and Au are successively stacked. The element Cr is formed at a thickness of about 1200–1500 [Å]. The element Cu is formed at a thickness of about 5000–7000 [Å]. The element Au is formed at a thickness of about 700–1100 [Å]. One end part of the bump electrode 8 formed on the side of the mother chip 2 is connected to the part of the wiring 2T being the external terminal BP with the barrier metal layer 2W interposed therebetween.

Figure 4:
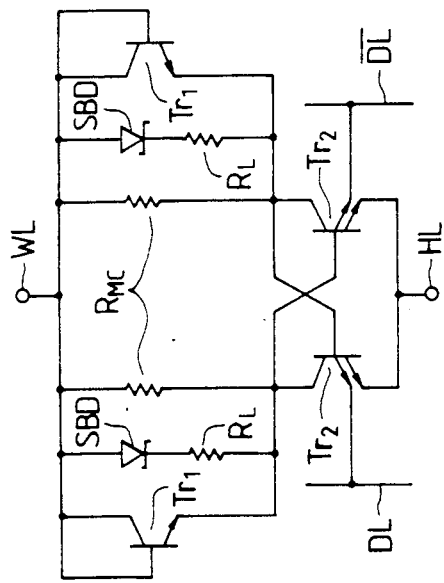
FIG. 4 is an equivalent circuit diagram of a memory cell of memory function built in the semiconductor chip.

The semiconductor chips (memory LSIs) 3 are constructed of SRAMs. As shown in FIG. 2, each of the semiconductor chips 3 has a memory cell array MARY arranged centrally. In the memory cell array MARY, a plurality of memory cells are arranged in the shape of a matrix. As shown in FIG. 4 (an equivalent circuit diagram of the memory cell), the memory cell is constructed of the Schottky barrier type which is configured of bipolar transistors. This memory cell is constructed within an area which is defined by a word line WL and a data holding line HL which extend in a column direction, and complementary digit lines DL and $\overline{DL}$. That is, the memory cell is configured of two parasitic n-p-n bipolar transistors $Tr_1$, two reverse n-p-n bipolar transistors $Tr_2$, two Schottky barrier diodes SBD, two memory cell resistances $R_{MC}$ and two low resistances $R_L$.

As shown in FIG. 2, peripheral circuits which consist of an input circuit Din, an output circuit Dout, a power source circuit VC, an address buffer circuit AB, an X-driver circuit XD and a Y-driver circuit YD are arranged in the peripheral circuit of the semiconductor chip 3. Semiconductor elements which constitute each of the peripheral circuits are bipolar transistors. Although not shown, the bipolar transistor constituting the semiconductor chip (memory LSI) 3 is substantially the same in structure as the bipolar transistor constituting the semiconductor chip (logic LSI) 2.

The semiconductor chip 3 is constructed of a two-layer wiring structure (two layers of aluminum wiring). External terminals BP are formed of the second layer of wiring. The external terminals BP are formed on the respectively peripheral circuits. They are not formed on the memory cell array MARY in order to reduce soft errors ascribable to alpha particles which appear from slight amounts of radioactive elements (U and Th) contained in the bump electrode 8. The memory cell configured of the bipolar transistors is more immune against the aplha-particle soft errors than a memory cell configured of MISFETs, but no external terminal BP is formed on the memory cell array MARY in order to enhance a margin against the soft errors.

Figure 5:
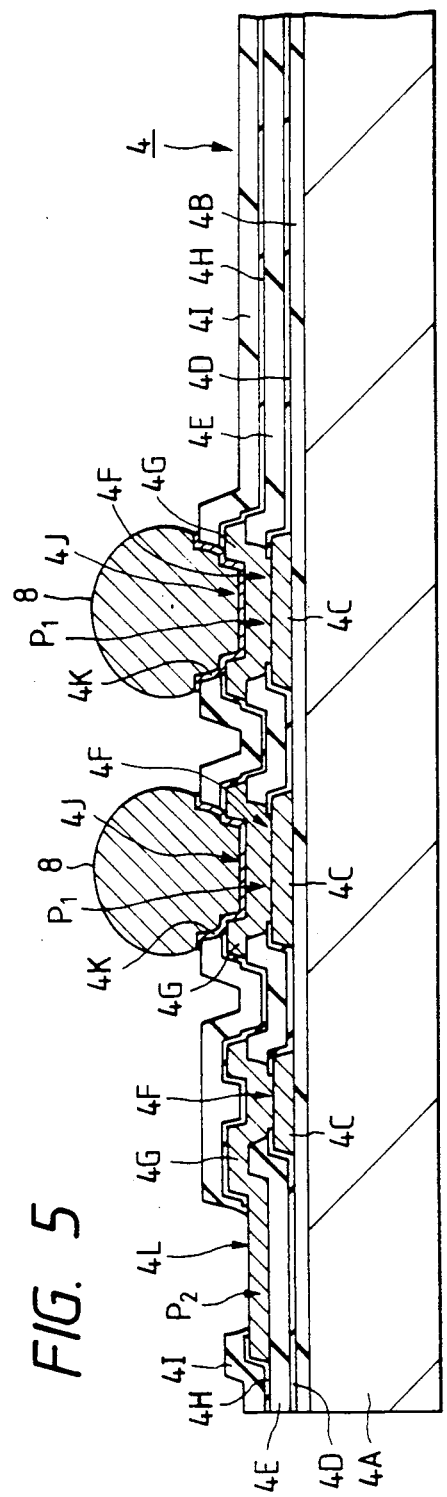
FIG. 5 is a sectional view of the essential portions of the mother chip.

The mother chip 4 is constructed as shown in FIG. 2 and FIG. 5 (a sectional view of the essential portions of the mother chip). The mother chip 4 is provided with the first layer of wiring 4C which is laid on the front surface of, for example, a silicon substrate 4A with an inter-layer insulator film 4B interposed therebetween. The silicon substrate 4A has the features of involving no difference in the coefficient of thermal expansion with respect to each of the semiconductor chips (single-crystal silicon substrate 2A) 2 and 3, and exhibiting a favorable heat transfer property. The inter-layer insulator film 4B is formed of a silicon oxide film which is produced by oxidizing the principal surface of the silicon substrate 4A. The wiring 4C is formed of an aluminum film, or an aluminum film doped with Si.

The first layer of wiring 4C is overlaid with the second layer of wiring 4G with inter-layer insulator films 4D and 4E interposed therebetween. The wiring 4G is formed of substantially the same material as that of the wiring 4C. The wiring 4G and the wiring 4C are connected through contact holes 4F which are provided in the inter-layer insulator films 4D and 4E. The inter-layer insulator film 4D is mainly used as an etching stopper layer, and it is formed of a silicon nitride film deposited by, for example, plasma CVD. The inter-layer insulator film 4E is mainly constructed so as to electrically isolate the wiring 4C and the wiring 4G, and it is formed of a silicon oxide film deposited by, for example, sputtering. The contact holes 4F are formed by subjecting the inter-layer insulator film 4E to isotropic wet etching and the inter-layer insulator film 4D to anisotropic dry etching.

The second layer of wiring 4G is overlaid with passivation films 4H and 4I. The passivation film 4H is formed of a silicon nitride film by way of example. The passivation film 4I is formed of a silicon oxide film by way of example.

As shown in FIG. 5, the second layer of wiring 4G constructs internal terminals $P_1$ in the predetermined areas of the central part of the mother chip 4. The internal terminals $P_1$ are constructed so as to be connected with the external terminals BP of the respective semiconductor chips 2 and 3 through the bump electrodes 8. The part of the wiring 4G constructing each internal terminal $P_1$ is overlaid with a barrier metal layer 4K through an opening 4J which is formed in the passivation films 4H and 4I. The barrier metal layer 4K is constructed of substantially the same structure (Au/Cu/Cr) as that of the barrier metal layer 2W which is provided on the front surface of the external terminal BP of each of the semiconductor chips 2 and 3. The openings 4J are formed by isotropic wet etching. The barrier metal layer 4K is overlaid with the bump electrodes 8.

The second layer of wiring 4G constructs external terminals $P_2$ in the predetermined areas of the peripheral part of the mother chip 4. An opening 4L which is formed in the passivation films 4H and 4I is provided on the part of the wiring 4G constructing each external terminal $P_2$. The opening 4L is constructed so as to connect a piece of bonding wire 12 to the part of the wiring 4G constructing the external terminal $P_2$. The openings 4L are formed by subjecting the passivation film 4I to isotropic wet etching.

As will be described in detail later, each of the bump electrodes 8 is constructed on the part of the wiring 4G constructing the internal terminal $P_1$ of the mother chip 4, by interposing the barrier metal layer 4K therebetween and with the lift-off technique. That is, the other end side of the bump electrode 8 is connected to the internal terminal $P_1$. The bump electrodes 8 are made of a solder (solder bump electrodes).

As shown in FIG. 1, the mother chip 4 is mounted on the base board 5 with a binding metal layer 9 interposed therebetween. The base board 5 is constructed of, for example, a silicon carbide board, which has the features of involving a small difference in the coefficient of thermal expansion with respect to the mother chip 4 and exhibiting a favorable heat transfer. The binding metal layer 9 is formed of an Au-Sn alloy by way of example.

Leads 10 are extended in the peripheral part of the base board 5 and between this base board 5 and the frame 7. The leads 10 are secured to both the base board 5 and the frame 7 by a low-melting glass 11. They are formed of an Fe-Ni alloy (42 Alloy) by way of example. The inner lead portion of each lead 10 is connected to the part of the wiring 4G being the corresponding external terminal $P_2$ of the mother chip 4 by interposing the bonding wire piece 12 therebetween.

The bonding wire 12 is made of aluminum. Each bonding wire piece 12 is connected to both the inner lead portion of the lead 10 and the part of the wiring 4G constructing the external terminal $P_2$ of the mother chip 4, by ultrasonic bonding.

The mother chip 4 carrying the semiconductor chips 2 and 3 thereon, the inner lead portions of the leads 10, and the pieces of bonding wire 12 are hermetically sealed with a sealant 14. A silicone gel, for example, is used as the sealant 14. The silicon gel is formed by potting.

The base board 5 and the frame 7 are secured by the low-melting glass 11, while the frame 7 and the sealing cap 6 are secured by an adhesive 13. A silicon rubber, for example, is used as the adhesive 13. The frame 7 is formed of a mullite material by way of example. The sealing cap 6 is formed of a ceramic material by way of example.

A radiating fin 16 is provided on the rear surface of the base board 5 (the surface thereof remote from the mounting surface of the mother chip 4) with an adhesive 15 interposed therebetween. The radiating fin 16 is attached in order to emit out heat generated in the respective semiconductor chips 2 and 3. A silicone rubber, for example, is used as the adhesive 15.

The outer lead portion of each of the leads 10 is molded into the shape of letter L. A solder layer is provided on the surface of the other lead portion though not shown. Such outer lead portions are connected to a wiring board (baby board) 17.

Now, a method of forming the mother chip 4 and bump electrodes 8 of the semiconductor integrated circuit device 1 will be briefly described with reference to FIGS. 6 thru 15 (sectional views of essential portions illustrative of respective manufacturing steps).

First, a silicon substrate 4A is prepared. Thereafter, an inter-layer insulator film 4B is formed on the whole front surface of the silicon substrate 4A. The inter-layer insulator film 4B is formed of a silicon oxide film which is produced by oxidizing the front surface of the silicon substrate 4A. It is formed at a thickness of, for example, about 1.1–1.3 [μm].

Subsequently, the first layer of wiring 4C is formed on the inter-layer insulator film 4B as shown in FIG. 6. The wiring 4C is formed of an aluminum (Al-Si) film deposited by sputtering, and is formed at a thickness of about 1.8–2.2 [μm]. This wiring 4C is patterned by isotropic wet etching. That is, the wiring 4C is so formed that the stepped shape of each side wall can be moderated to enhance the step converage of an upper wiring layer.

Subsequently, inter-layer insulator films 4D and 4E are respectively and successively stacked on the whole front surface of the substrate including the wiring 4C. Since the inter-layer insulator film 4D is used as an etching stopper layer, it is formed so as to have an etching rate unequal to that of the inter-layer insulator film 4E. The inter-layer insulator film 4D is formed of a silicon nitride film deposited by, for example, plasma CVD and is formed at a thickness of about 0.4–0.6 [μm]. The inter-layer insulator film 4E is so formed that the wiring 4C and the upper wiring layer thereof can be electrically isolated satisfactorily. This inter-layer insulator film 4E is formed of a silicon oxide film deposited by, for example, sputtering and is formed at a thickness of about 3.4–3.6 [μm].

Next, as shown in FIG. 7, the parts of the inter-layer insulator films 4D and 4E overlying the parts of the wiring 4C to be connected with the upper wiring layer are removed to from contact holes 4F. The contact holes 4F can be formed by subjecting the inter-layer insulator film 4E to isotropic wet etching and the inter-layer insulator film 4D to anisotropic dry etching. In forming the contact holes 4F, the inter-layer insulator film 4D is used as the etching stopper layer, so that the etching amount of the inter-layer insulator film 4E having the sufficient thickness can be readily controlled. Besides, the inter-layer insulator film 4E is etched by the isotropic wet etching, so that the contact holes 4F can have the stepped shape moderated to enhance the step coverage of the upper wiring layer.

Figure 8:
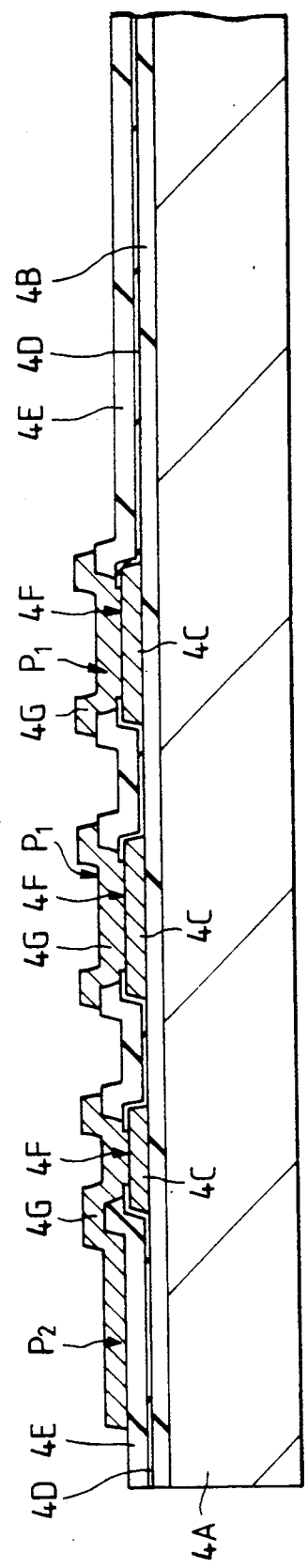

Next, as shown in FIG. 8, the second layer of wiring 4G is formed on the inter-layer insulator film 4E so as to be connected with the wiring 4C through the contact holes 4F. The wiring 4G forms, not only wiring lines for transmitting signals, but also the internal terminals $P_1$ and external terminals $P_2$ of the mother chip 4. The wiring 4G is formed of an aluminum (Al-Si) film deposited by sputtering likewise to the wiring 4C, and it is formed at a thickness of about 2.4–2.6 [μm]. The wiring 4G is patterned by isotropic wet etching.

At the next step, a passivation film 4H is formed on the whole front surface of the substrate including the wiring 4G. The passivation film 4H is formed of a silicon nitride film deposited by, for example, plasm CVD and is formed at a thickness of about 0.4–0.6 [μm].

Figure 9:
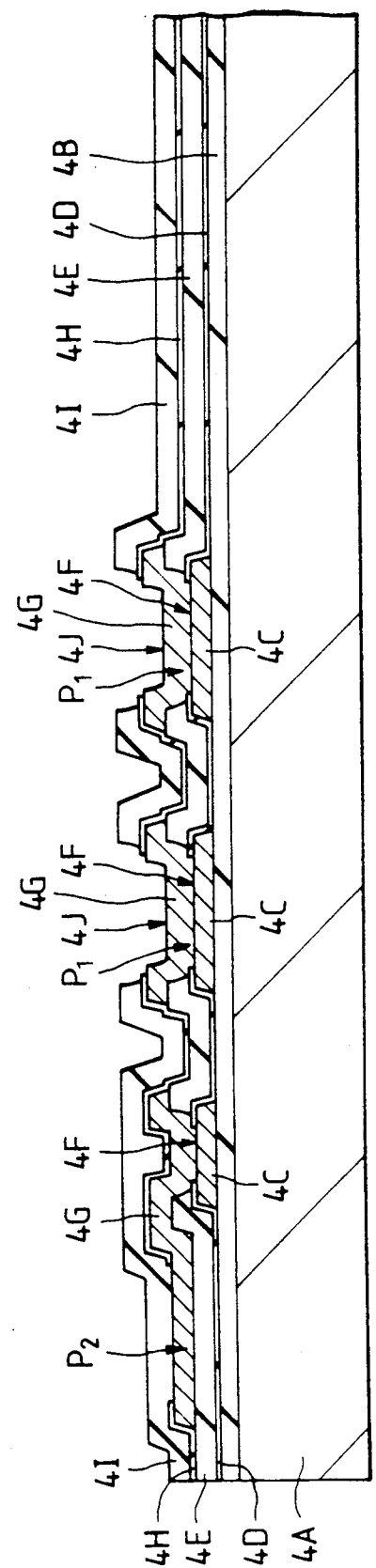

Subsequently, a passivation film 4I is formed on the whole front surface of the substrate including the wiring 4G and the passivation film 4H. The passivation film 4I is formed of a silicon oxide film deposited by, for example, sputtering and is formed at a thickness of about 3.4–3.6 [μm]. Thereafter, as shown in FIG. 9, the parts of the passivation film 4I overlying the areas of the wiring 4G for forming the internal terminals $P_1$ are removed to form openings 4J. The openings 4J are formed by subjecting the passivation film 4I to isotropic wet etching. Next, the passivation film 4H is provided with openings by dry etching.

Subsequently, as shown in FIG. 10, a barrier metal layer 4K is formed within the openings 4J and on the areas of the wiring 4G for forming the internal terminals $P_1$. The barrier metal layer 4K is formed by stacking Cr, Cu and Au in succession. The element Cr is deposited by evaporation or sputtering, and is formed at a thickness of about 1200–1500 [Å]. The element Cu is deposited by evaporation or sputtering, and is formed at a thickness of about 5000–7000 [Å]. The element Au is deposited by evaporation or sputtering, and is formed at a thickness of about 700–1100 [Å]. By way of example, the barrier metal layer 4K is patterned by combining isotropic wet etching and anisotropic dry etching.

At the next step, as shown in FIG. 11, the part of the passivation film 4I overlying the area of the wiring 4G for forming the external terminal $P_2$ is removed to form an opening 4L. The opening 4L is constructed of substantially the same structure as that of the opening 4J.

That is, the opening 4L is formed by subjecting the passivation film 4I to isotropic wet etching.

At the next step, although no illustration is made, the rear surface of the silicon substrate 4A is subjected to back grinding, and a barrier metal layer is formed on the surface thus treated. This barrier metal layer is constructed of substantially the same structure as that of the foregoing barrier metal layer 4K. Thereafter, Au is evaporated on the outer surface of the barrier metal layer deposited on the rear surface of the silicon substrate 4A. The Au layer forms part of the binding metal layer 9 in the case of securing the mother chip 4 to the base board 5.

Figure 12:
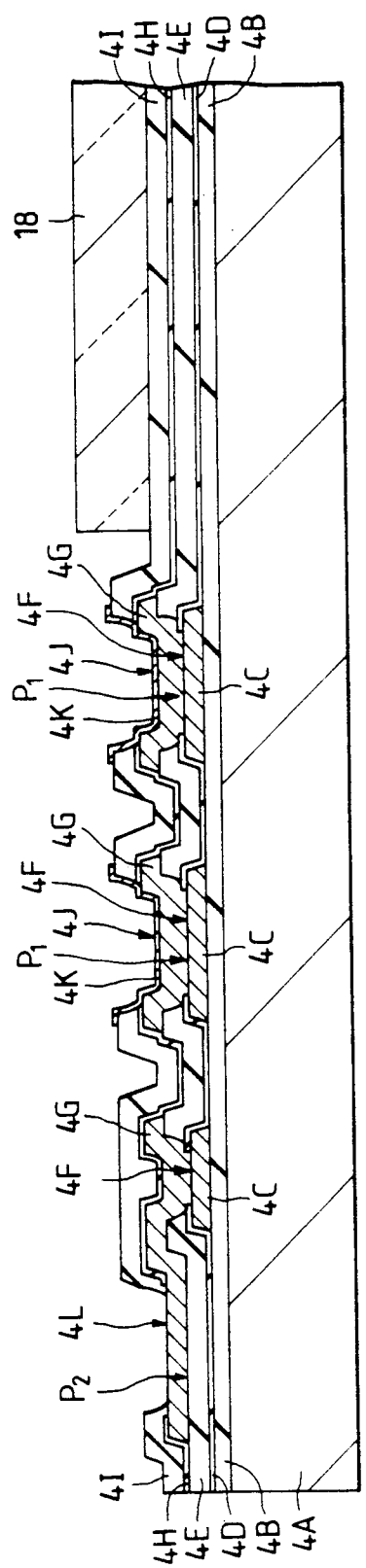
Figure 16:
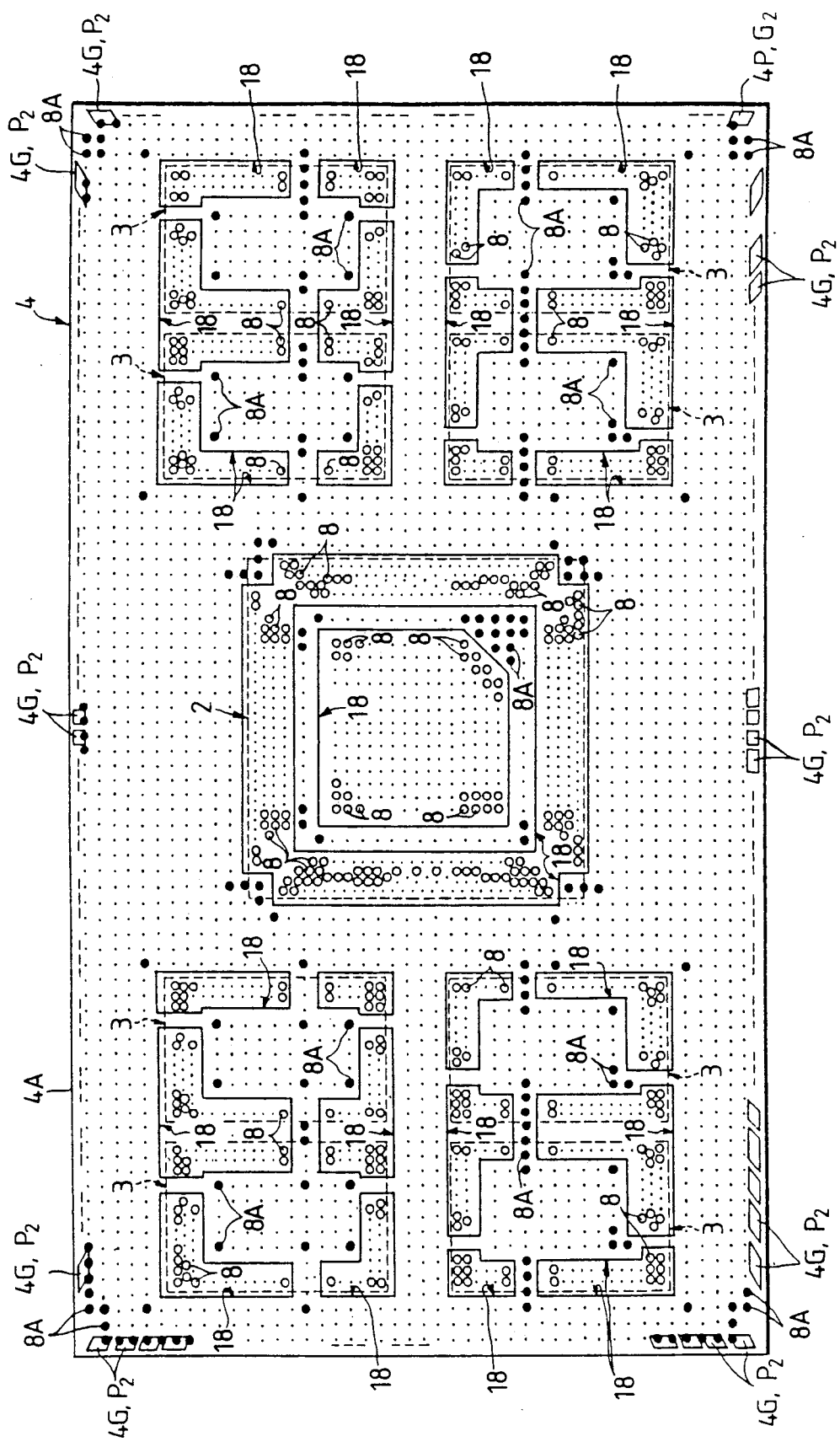
FIG. 16 is a plan view of the mother chip showing areas for forming the bump electrodes and dummy bump electrodes.

Subsequently, lift-off for forming bump electrodes 8 is carried out. More specifically, as shown in FIG. 12, a first resist film 18 is initially formed on the part of the passivation film 4I corresponding to that area of the mother chip 4 in which no bump electrode (conductor film) 8 is provided. The first resist film 18 is formed in areas indicated in FIG. 16 (a plan view of the mother chip showing areas for forming the bump electrodes and dummy bump electrodes). That is, in the area where the semiconductor chip (logic LSI) 2 is mounted, the bump electrodes 8 are formed in the area of the logic circuit portion Logic and the area of the peripheral circuits, so that except these areas, the first resist film 18 is formed on the part of the passivation film 4I corresponding to the area between both the areas. In each of the areas where the semiconductor chips (memory LSIs) 3 are mounted, the bump electrodes 8 are formed in the area of the peripheral circuits, so that except this area, the first resist film 18 is formed on the part of the passivation film 4I corresponding to the memory cell array MARY. In the area where none of the semiconductor chips 2 and 3 is mounted, the bump electrodes 8 are not formed, so that the first resist film 18 is formed on the part of the passivation film 4I corresponding to the whole area.

The first resist film 18 is formed of a photoresist film of, for example, polymethyl methacrylate (monomer system) and is formed at a thickness of about 1.0–6.0 [$\mu$m]. After being applied to the whole front surface of the substrate, the above solution is baked at a temperature of about 120 [°C.], and the baked material has its predetermined parts exposed to light and is then developed, whereby the first resist film 18 is left in only the areas in which the bump electrodes 8 are not formed.

Figure 13:
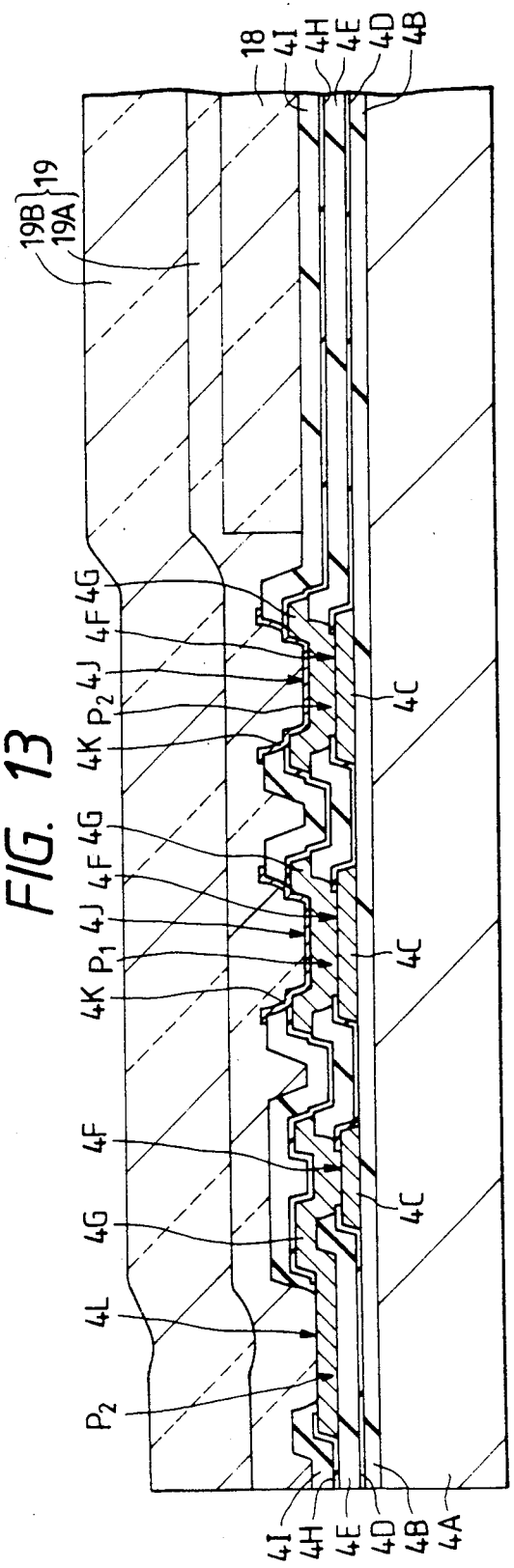

Subsequently, as shown in FIG. 13, a second resist film 19 is formed on the whole front surface of the substrate which includes the parts of the passivation film 4I corresponding to the areas where the bump electrodes 8 are formed and the parts of the first resist film 18 corresponding to the areas where the bump electrodes 8 are not formed. The second resist film 19 is constructed of a two-layer structure in which a film-resist film 19B is stacked on the upper surface of a subbing resist film 19A.

The subbing resist film 19A is formed so that the film-resist film 19B may be brought into close contact with the underlying structure thereof even in cases of the appearances of a stepped shape ascribable to the wiring 4C or the wiring 4G, a stepped shape ascribable to the contact hole 4F or the opening 4J and a stepped shape at the end part of the first resist film 18. That is, the subbing resist film 19A is constructed so as to prevent the film-resist film 19B from stripping off the underlying structure. The subbing resist film 19A is formed of a photoresist film of the same material as that of the first resist film 18, for example, polymethyl methacrylate and is formed at a thickness of about 3.4–3.6 [$\mu$m]. This subbing resist film 19A can be formed in such a way that the above material is applied to the whole front surface of the substrate and is thereafter baked at a temperature of about 120 [°C.].

The film-resist film 19B is formed at a great thickness in order to attain a height required for the bump electrodes 8. This film-resist film 19B is formed of a photoresist film of the same material as that of each of the first resist film 18 and the subbing resist film 19A, for example, polymethyl methacrylate and is formed at a thickness of about 30–40 [$\mu$m]. Although not shown, a cover film as a protective film (at a thickness of about 20 [$\mu$m]) is held deposited on the upper surface of the film-resist film 19B after the exposure of this film 19B to light and till a time preceding the development thereof. The film-resist film 19B is formed by thermally compressing the material film onto the upper surface of the subbing resist film 19A into the laminated structure.

Figure 14:
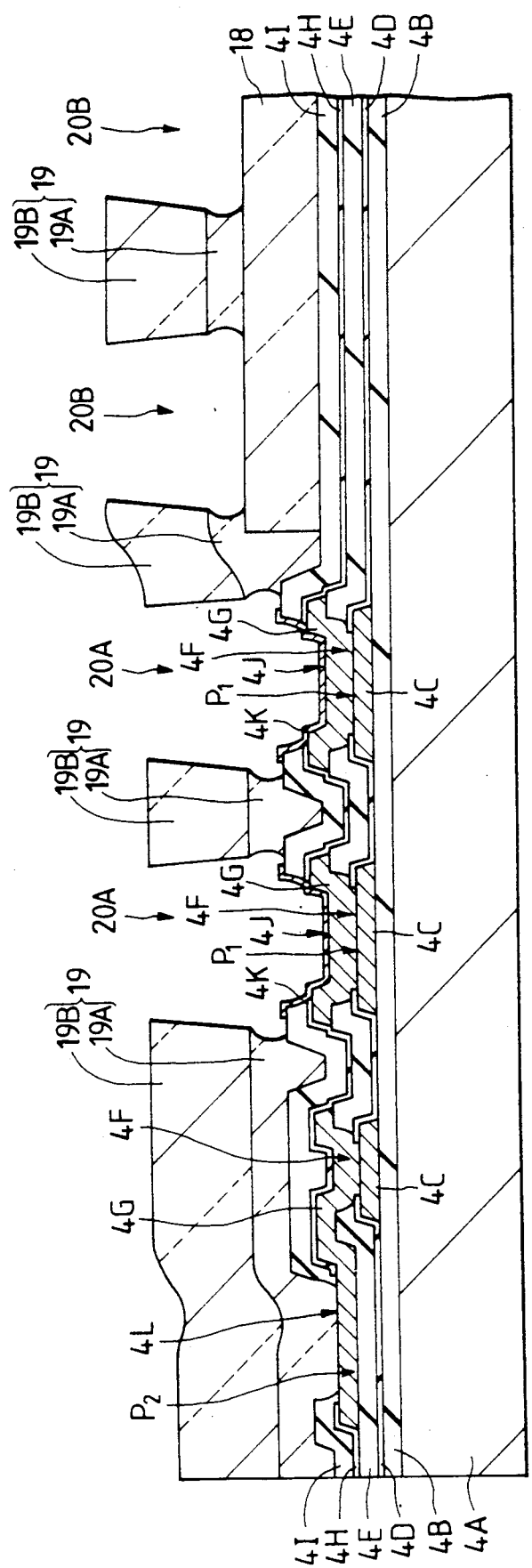

Subsequently, as shown in FIG. 14, first openings 20A are provided in the parts of the second resist film 19 for forming the bump electrodes 8 (overlying the internal terminals $P_1$), and second openings 20B for forming dummy bump electrodes 8A are provided in the areas of the second resist film 19 for forming no bump electrode 8 (overlying the first resist film 18). The first openings 20A and the second opening 20B can be respectively formed by exposing the second resist film 19 to light and then developing it. The first openings 20A are provided at intervals of, for example, about 200–300 [$\mu$m]. These first openings 20A for forming the bump electrodes 8 are provided at a high density in order to attain an increased number of terminals. On the other hand, the second openings 20B are provided at intervals equal to or greater than those of the first openings 20A. The second openings 20B need not be provided at a higher density as compared with the first openings 20A, and are preferably provided at somewhat greater intervals in order to enhance the available percentage of products in manufacture. However, at least one first opening 20A or second opening 20B is provided within an extent of about 1 [mm$^2$] in order that both the first resist film 18 and the second resist film 19 may be reliably stripped off so as to prevent the occurrence of inferior stripping.

Figure 15:
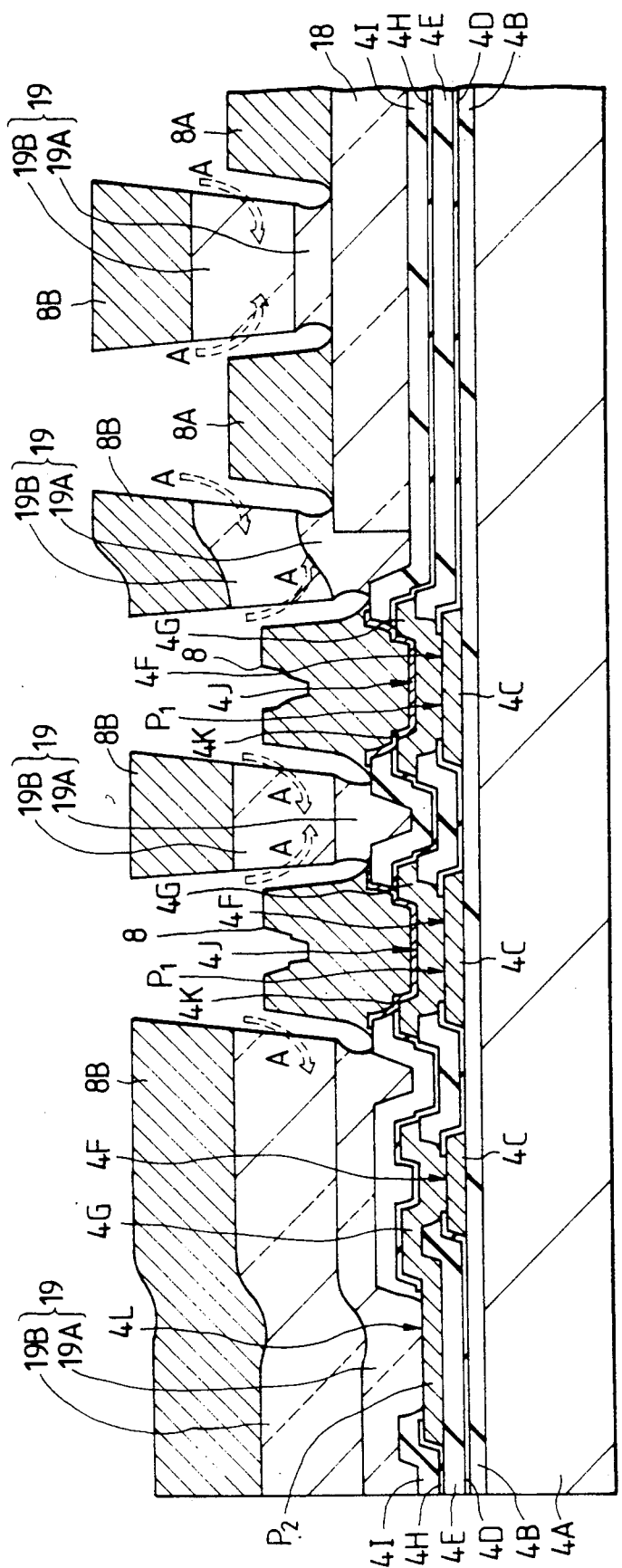

At the next step, as shown in FIG. 15, a metal film (conductor film) 8B is formed on the whole surface of the substrate overlying the second resist film 19. A solder deposited by evaporation is used for the metal film 8B. The solder is formed of, for example, 95 [weight-%] of Pb and 5 [weight-%] of Sn. The metal film 8B is formed at a thickness of, for example, about 15–100 [$\mu$m] (this thickness corresponds to the height of the bump electrodes 8). By forming this metal film 8B on the whole front surface of the substrate, the bump electrodes 8 can be formed within the first openings 20A of the second resist film 19 and on those parts of the upper surface of the barrier metal layer 4K which overlie the parts of the wiring 4G being the internal terminals $P_1$. These bump electrodes 8 are formed as indicated by marks ○ (some of which are replaced with marks ●) in FIG. 16. Besides, the dummy bump electrodes 8A can be formed on the first resist film 18 within the second openings 20B of the second resist film 19 (the areas where no bump electrode 8 is formed). These dummy bump electrodes 8A are formed as indicated by marks  (some of which are replaced with marks ○) in FIG. 16.

At the next step, both the second resist film 19 and the first resist film 18 are removed. The removal is performed with a peeling liquid, for example, methylene chloride. If necessary, an ultrasonic treatment may well be carried out at the removal step. Since the first resist film 18 and the subbing resist film 19A and film-resist film 19B of the second resist film 19 are all formed of the same photoresist films, they can be stripped off by the single stripping step. In the areas where the bump electrodes 8 are formed, the first openings 20A are densely provided, and hence, the peeling liquid can sufficiently permeate into the second resist film 19 as indicated by arrows A in FIG. 15. Besides, in the areas where the bump electrodes 8 are not formed, the second openings 20B for forming the dummy bump electrodes 8A are provided at a density equal or close to that of the first openings 20A, and hence, the peeling liquid can sufficiently permeate into the second resist film 19 and the first resist film 18 as indicated by arrows A in FIG. 15.

Owing to the removal of both the second resist film 19 and the first resist film 18, the dummy bump electrodes 8A on the first resist film 18 and the metal film 8B on the second resist film 19 can be removed in the state in which the bump electrodes 8 formed through the barrier metal layer 4K on the parts of the wiring 4G being the internal terminals $P_1$ are left behind.

A view of the finished mother chip 4 in the state in which the bump electrodes 8 formed as described above have been subjected to reflowing, is shown in FIG. 5 referred to before. The reflowing is conducted at a temperature of about 340–350 [°C.].

In this manner, a method of manufacturing a semiconductor integrated circuit device 1 wherein bump electrodes (a conductor film) 8 are formed on a front surface of a mother chip 4 by a lift-off technique; comprises forming a first resist film 18 on that area of the surface of the mother chip 4 on which the bump electrode 8 is not formed, forming a second resist film 19 on the whole surface of the mother chip 4 including said first resist film 18 and an area for forming said bump electrode 8, providing a first opening 20A for forming said bump electrode 8 in an area of said second resist film 19 for forming said bump electrode 8 and also providing a second opening 20B for forming a dummy bump electrode (dummy conductor film) 8A in that area of said second resist film 19 in which said bump electrode 8 is not formed, depositing a metal film 8B on the whole surface of said mother chip 4 including the surface of said mother chip 4 inside said first opening 20A, said first resist film 18 inside said second opening 20B and said second resist film 19, and removing said second resist film 19 and said first resist film 18 respectively, so as to leave said bump electrode 8 inside said first opening 20A and to remove said metal film 8B on said second resist film 19 and said dummy bump electrode 8A on said first resist film 18, whereby said second opening 20B for forming said dummy bump electrode 8A is provided in the area of said second resist film 19 in which said bump electrode 8 is not formed, and a peeling solution is positively caused to permeate into said second resist film 19 through said second opening 20B, so that the stripping property of the area of said second resist film 19 where said bump electrode 8 is not formed can be enhanced.

Besides, in addition to the above expedient, both said first resist film 18 and said second resist film 19 are formed of an identical material, and they are stripped off by an identical step after the deposition of said metal film 8B, whereby in addition to the above functional effect, said first resist film 18 can be removed by the step of removing said second resist film 19, so that the number of the manufacturing steps of said semiconductor integrated circuit device 1 can be decreased in correspondence with a process for stripping off said first resist film 18.

Further, said second resist film 19 is formed of a two-layer structure in which a subbing resist film 19A of excellent flowability is overlaid with a film-resist film 19B, whereby the stepped shapes etc. based on the formation of said first resist film 18 can be moderated to enhance the close contact between the underlying structure and said film-resist film 19B, so that inferior stripping in which said film-resist film 19B strips off before or after the evaporation of said metal film 8B or before the step of stripping off said second resist film 19 as well as said first resist film 18 can be prevented to enhance the available percentage of products in manufacture.

Now, a process for assembling the semiconductor integrated circuit device 1 will be briefly described with reference to FIGS. 17 thru 20 (schematic sectional views of the semiconductor integrated circuit device showing respective assembling steps).

First, as shown in FIG. 17, the semiconductor chips 2 and 3 are respectively mounted (as chip mounting) on the mother chip 4 with the bump electrodes 8 interposed therebetween. The bump electrodes 8 are formed on the side of the mother chip 4 as stated before, and the respective semiconductor chips 2, 3 and the mother chip 4 can be connected and secured by subjecting these bump electrodes 8 to reflowing. The reflowing is conducted at the temperature of about 340–350 [°C.] as stated before.

Subsequently, the mother chip 4 is mounted on the base board 5. The base board 5 and the mother chip 4 are secured by the binding metal layer 9. The binding metal layer 9 is made of the Au-Sn alloy as stated before.

Subsequently, as shown in FIG. 18, the frame 7 is attached to the peripheral part of the base board 5. In attaching the frame 7, the leads 10 are simultaneously fixed between the base board 5 and the frame 7. The fixation of the frame 7 and the leads 10 to the base board 5 is effected with the low-melting glass 11.

Next, the external terminals $P_2$ of the mother chip 4 and the inner lead portions of the leads 10 are connected by the pieces of bonding wire 12. The bonding of the bonding wire 12 is performed by ultrasonic bonding.

Next, as shown in FIG. 19, the mother chip 4, semiconductor chips 2, 3 and bonding wire pieces 12 which lie within an area defined by the frame 7 are hermetically sealed with the sealant 14. The silicone gel is used as the sealant 14. After being applied by potting, the silicone gel is hardened by baking.

At the next step, the sealing cap 6 is attached to the frame 7 with the adhesive 13 interposed therebetween. The attachment of the sealing cap 6 is carried out in the state in which the interior of a cavity formed by the base board 5, frame 7 and sealing cap 6 is held vacuum.

At the next step, the solder layers are formed on the surfaces of the outer lead portions of the leads 10. They are formed by dipping the pertinent portions into a solder bath.

Figure 20:
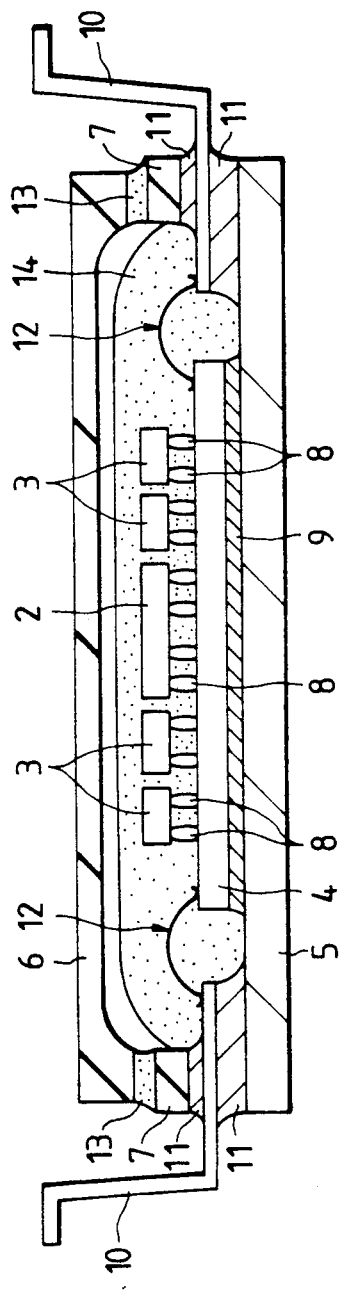

Subsequently, as shown in FIG. 20, the outer lead portions of the leads 10 are cut away from the frame member of a lead frame and are molded into the predetermined shape.

Subsequently, the radiating fin 16 is installed on the rear surface of the base board 5 with the adhesive 15 interposed therebetween. The semiconductor integrated circuit device 1 is finished up by the installation of the radiating fin 16.

Subsequently, the semiconductor integrated circuit device 1 is mounted on the wiring board 17 as shown in FIG. 1 referred to before.

Incidentally, although the above embodiment has been described as to the example in which the bump electrodes 8 are formed on the side of the internal terminals $P_1$ of the mother chip 4 of the semiconductor integrated circuit device 1, the present invention may well form the bump electrodes 8 on the side of the external terminals BP of the respective semiconductor chips 2 and 3.

Now, there will be described another embodiment in which the present invention is applied to a mixed type semiconductor chip (Bi-CMOS) wherein bipolar transistors and complementary MISFETs (CMOS) coexist, the semiconductor chip having a memory function.

Figure 21:
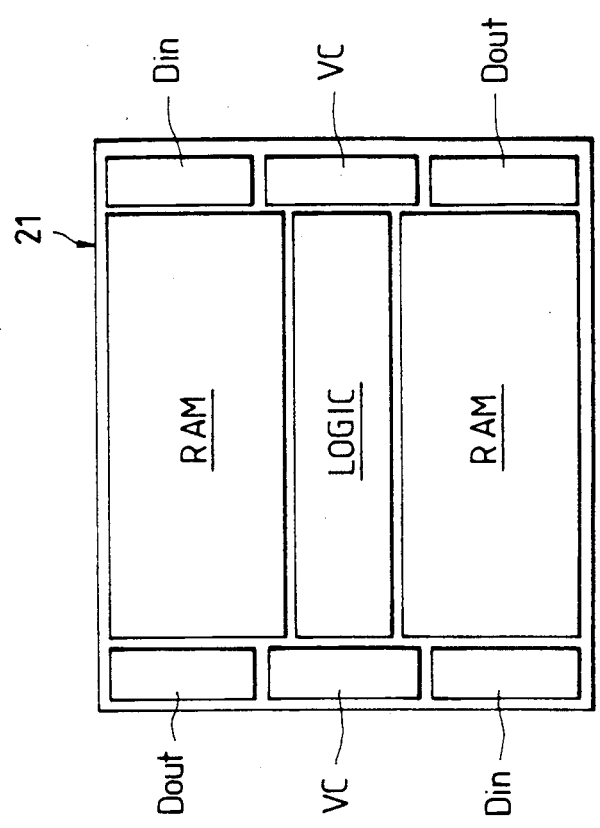
FIG. 21 is a layout plan showing the construction of a semiconductor chip in a semiconductor integrated circuit device which is another embodiment of the present invention.

The construction of the semiconductor chip of a semiconductor integrated circuit device in this embodiment of the present invention is shown in FIG. 21 (a layout plan of the semiconductor chip).

As shown in FIG. 21, the mixed type semiconductor chip 21 has a logic circuit portion "Logic" arranged at the central part thereof and memory circuit portions "RAM" arranged on the upper and lower sides thereof, respectively. An input circuit Din, an output circuit Dout and a power source circuit VC are arranged at each of the right and left edge parts of the semiconductor chip 21.

The logic circuit portion Logic of the semiconductor chip 21 is configured of semiconductor elements which consist mainly of complementary MISFETs. Each of the memory circuit portions RAM is constructed of an SRAM, and is configured of semiconductor elements which consist mainly of MISFETs. Each of the peripheral circuits Din, Dout and VC is configured of semiconductor elements which consist mainly of bipolar transistors. Regarding the peripheral circuits, it is also allowed that the output circuit Dout especially requiring a driving ability is configured of bipolar transistors, whereas the input circuit Din is configured of complementary MISFETs.

Figure 22:
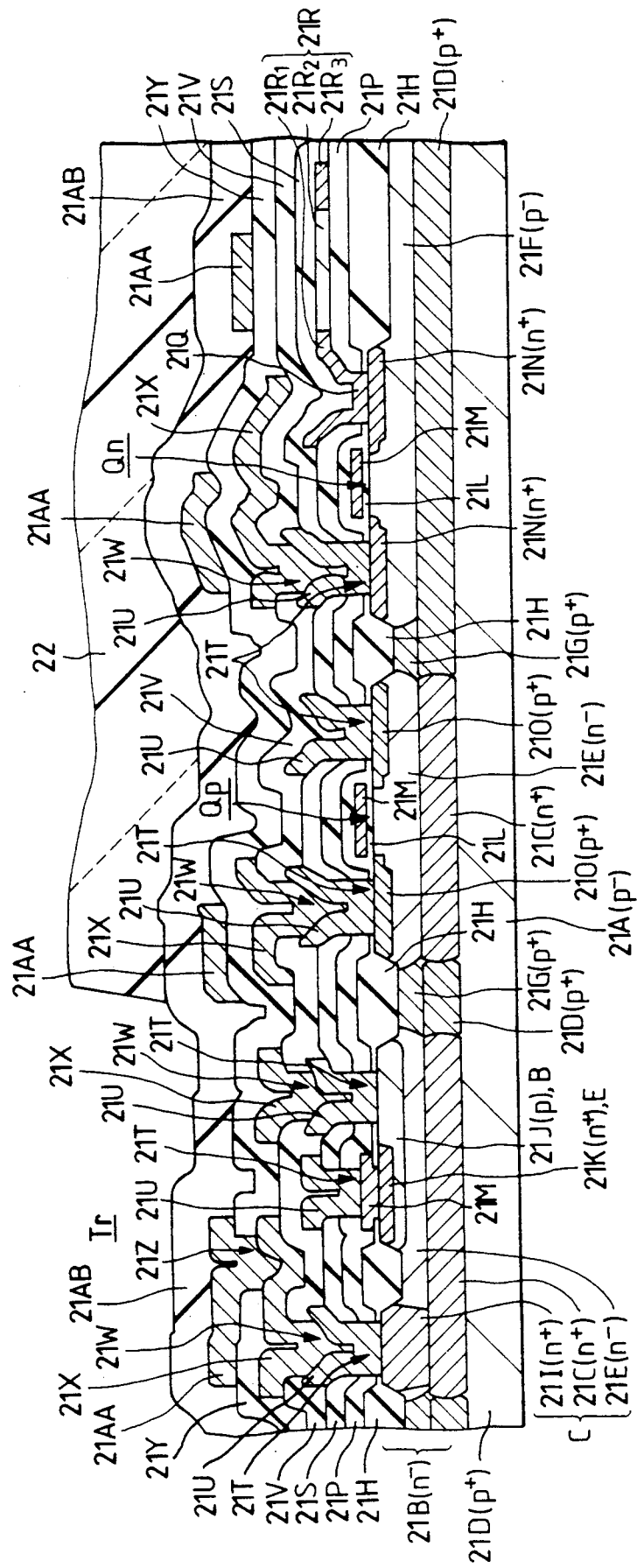
FIG. 22 is a sectional view of essential portions showing the structures of various semiconductor elements which constitute the semiconductor chip.

The concrete structures of the individual semiconductor elements constituting the semiconductor chip 21 are shown in FIG. 22 (a sectional view of essential portions). The bipolar transistor is illustrated on the left side of FIG. 22, the p-channel MISFET at the central part thereof, and the n-channel MISFET on the right side thereof.

As shown in FIG. 22, the semiconductor chip is so constructed that an $n_-$-type epitaxial layer 21B is grown on the principal surface of a $p^-$-type semiconductor substrate 21A made of single-crystal silicon.

The bipolar transistor Tr is electrically isolated from the other regions by an isolation region which consists of the semiconductor substrate 21A, a buried $p^+$-type semiconductor region 21D, a $p^+$-type semiconductor region 21G and an element isolating insulator film 21H. The semiconductor region 21D is formed between the semiconductor substrate 21A and the epitaxial layer 21B. The bipolar transistor Tr is constructed of the n-p-n type which consists of an n-type collector region C, a p-type base region B and an n-type emitter region E.

The collector region C is made up of a buried $n^+$-type semiconductor region 21C, an $n^-$-type well region 21E and a potential pulling-up $n^+$-type semiconductor region 21I. The first layer of wiring 21U is connected to the semiconductor region 21I of the collector region C through a contact hole 21T which is provided in inter-layer insulator films 21P and 21S. The wiring 21U is formed of an aluminum film, or an aluminum film doped with Cu or/and Si.

The base region B is made up of a p-type semiconductor region 21J which is provided in the principal surface part of the well region 21E. The wiring 21U is connected to the semiconductor region 21J being the base region B.

The emitter region E is made up of an $n^+$-type semiconductor region 21K which is provided in the principal surface part of the semiconductor region 21J constructing the base region B. An emitter electrode 21M is connected to the semiconductor region 21K being the emitter region E. The emitter electrode 21M is formed of the first layer of polycrystalline silicon film into which an n-type impurity is introduced. The semiconductor region 21K is formed in such a way that the n-type impurity introduced in the emitter electrode 21M is diffused into the semiconductor region 21J. The wiring 21U is connected to the emitter electrode 21M.

The p-channel MISFET $Q_p$ of the complementary MISFETs is constructed in the principal surface of a well region 21E within an area which is enclosed with the element isolating insulator film 21H. This MISFET $Q_p$ is configured of the well region 21E, a gate insulator film 21L, a gate electrode 21M, and a pair of $p^+$-type semiconductor regions 210 which serve as a source region and a drain region.

The gate insulator film 21L is formed of a silicon oxide film which is produced by oxidizing the principal surface of the well region 21E.

The gate electrode 21M is formed of the polycrystalline silicon film into which the n-type impurity is introduced.

The semiconductor regions 210 are formed in such a way that a p-type impurity (for example, B) is introduced by ion implantation. Since the side of each semiconductor region 210 nearer to a channel forming region is formed at a low impurity concentration, the MISFET $Q_p$ is constructed of an LDD (Lightly Doped Drain) structure. The wiring 21U is connected to the smiconductor regions 210.

The n-channel MISFET $Q_n$ of the complementary MISFETs is constructed in the principal surface off a $p^-$-type well region 21F whithin an area which is enclosed with the element isolating insulator film 21H. This MISFET $Q_n$ is configured of the well region 21F, a gate insulator film 21L, a gate electrode 21M, and a pair of $n^+$-type semiconductor regions 21N which serve as a source region and a drain region. Likewise to the MISFET $Q_p$, the MISFET $Q_n$ is constructed of the LDD structure.

The wiring 21U is connected to one semiconductor region 21N of the MISFET $Q_n$. Wiring $21R_1$, a high-resistance load element $21R_2$ and wiring $21R_3$ are successively connected to the other semiconductor region 21N through a contact hole 21Q which is provided in the inter-layer insulator film 21P. Both the wiring $21R_1$ and the wiring $21R_3$ are formed by introducing an n-type impurity into the second layer of polycrystalline silicon film. In each of the memory circuit portion RAM, the wiring 21R₃ is used as a power source wiring line which feeds a supply voltage (for example, the operating voltage, 5 [V] of circuitry) $V_{cc}$ to memory cells. The high-resistance load element 21R₂ is formed by introducing no impurity into the aforementioned polycrystalline silicon film or somewhat introducing an n-type or p-type impurity thereinto.

The second layer of wiring 21X is provided on the wiring 21U with an inter-layer insulator film 21V interposed therebetween. The wiring 21X is connected with the wiring 21U through contact holes 21W which are formed in the inter-layer insulator film 21V. The third layer of wiring 21AA is provided on the wiring 21X with an inter-layer insulator film 21Y interposed therebetween. The wiring 21AA is connected with the wiring 21X through a contact hole 21Z which is formed in the inter-layer insulator film 21Y. The second layer of wiring 21X and the third layer of wiring 21AA are respectively made of, for example, the same material as that of the first layer of wiring 21U. In this manner, the semiconductor chip 21 is constructed of a three-layer wiring structure.

The third layer of wiring 21AA is overlaid with a passivation film 21AB. The passivation film 21AB is formed of a silicon nitride film which is deposited by, for example, sputtering.

In the area of each memory circuit portion RAM of the semiconductor chip 21 or/and the area of each circuit configured of the complementary MISFETs (for example, the logic circuit portion Logic or the input circuit Din), the passivation film 21AB is overlaid with an alpha-particle intercepting film 22. Although no illustration is made in FIG. 22, the alpha-particle intercepting film 22 is constructed so as to intercept alpha particles whose sources are, in the main, radioactive elements (U and Th) contained in slight amounts in the bump electrodes 8. The alpha-particle intercepting film 22 is formed of a polyimide type resin film, for example, a polyimide isoindoloquinazolinedione film. It is formed at a thickness of, for example, about 10–30 [μm].

Figure 23:
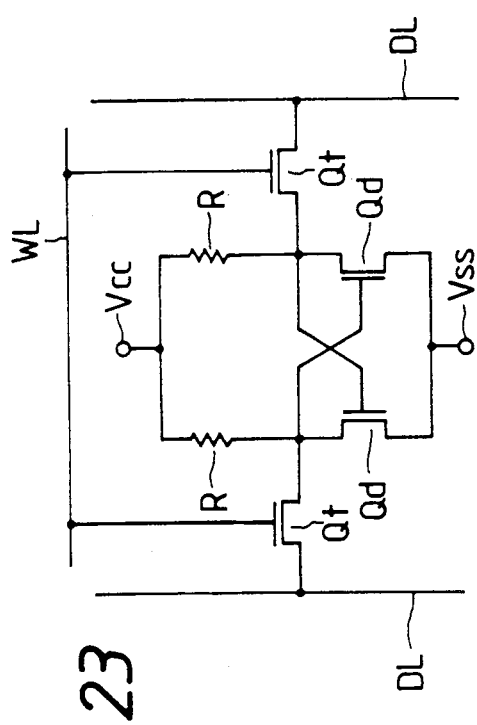
FIG. 23 is an equivalent circuit diagram showing the memory cell of an SRAM which is built in the semiconductor chip.

The memory circuit portion RAM of the semiconductor chip 21 is constructed of the SRAM as stated before, and each of the memory cells of this SRAM is constructed as shown in FIG. 23 (an equivalent circuit diagram of a memory cell).

As illustrated in FIG. 23, the memory cell of the SRAM is arranged at the part of intersection between complementary data lines DL, $\overline{DL}$ extending in a row direction and a word line WL extending in a column direction. This memory cell is constructed of the high-resistance load type.

The memory cell is configured of a flip-flop circuit which is used as an information storage portion, and two transfer MISFETs $Q_t$ each of which has one semiconductor region connected to the corresponding terminal of one pair of input/output terminals of the flip-flop circuit. The other semiconductor region of each of the transfer MISFETs $Q_t$ is connected to the corresponding one of the complementary data lines Dl and $\overline{DL}$. The gate electrodes of both the transfer MISFETs $Q_t$ are connected to the word line WL. Each of the transfer MISFETs $Q_t$ is constructed of the n-channel MISFET $Q_n$ shown in FIG. 22.

The flip-flop circuit is made up of two high-resistance load elements R and two drive MISFETs $Q_d$. Each of the high-resistance load elements R is formed of the high-resistance load element 21R₂ (polycrystalline silicon film) shown in FIG. 22. Each of the drive MISFETs $Q_d$ is formed of the n-channel MISFET $Q_n$ shown in FIG. 22. The supply voltage $V_{cc}$ is applied to one end of each of the high-resistance load elements R (the wiring 21R₃ is connected thereto). A reference voltage (for example, the reference potential, 0 [V] of the circuitry) $V_{ss}$ is applied to the semiconductor region 21N which is used as the source region of each of the drive MISFETs $Q_d$.

Figure 24:
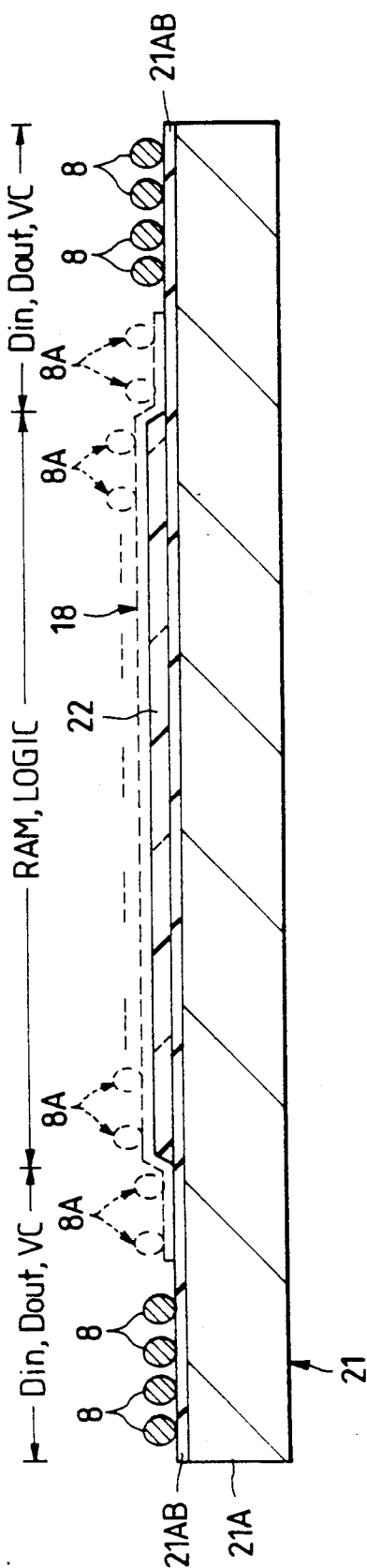
FIG. 24 is a model-like sectional view of the semiconductor chip.

The mixed type semiconductor chip 21 thus constructed is provided with the bump electrodes 8 on the external terminals BP as shown in FIG. 24 (a model-like sectional view of the semiconductor chip). That is, the bump electrodes 8 are arranged on those areas of the peripheral circuits which are constructed of the bipolar transistors Tr. In this embodiment, the bump electrodes 8 are not formed on the side of the mounting board for carrying the semiconductor chip 21 thereon, but they are formed on the side of the external terminals BP of the semiconductor chip 21.

The alpha particles whose sources are the bump electrodes 8 generate minority carriers upon entering the semiconductor substrate 21A, and the minority carriers afford changes to the potentials of the information charge storage portions (nodes) of the memory cells of the SRAM and induce soft errors, so that no bump electrode 8 is provided on, at least, the memory circuit portion RAM. Besides, the minority carriers are liable to be trapped in the gate insulator film 21L of each of the MISFET $Q_n$ and the MISFET $Q_p$ and in the interface between the gate insulator film 21L and the well region 21E or 21F and cause the threshold voltage of the MISFET to fluctuate, so that no bump electrode 8 is provided on the circuits each of which is mainly configured of the complementary MISFETs. That is, the bump electrodes 8 are not formed on the memory circuit portions RAM, on the logic circuit portion Logic which is configured of the complementary MISFETs, and on those of the peripheral circuits which are configured of the complementary MISFETs. In the areas where the bump electrodes 8 are not formed, the alpha-particle intercepting film 22 is provided on the passivation film 21AB. Since the bipolar transistor Tr is more immune against the alpha-particle soft errors as compared with each of the MISFETs $Q_n$ and $Q_p$, the alpha-particle intercepting film 22 is not provided on the area of the bipolar transistor Tr.

In additon, the alpha-particle intercepting film 22 is provided outside the areas where the bump electrodes 8 are formed. The alpha-particle intercepting film 22 differs in the coefficient of thermal expansion from the semiconductor substrate 21A of the semiconductor chip 21, so that when the alpha-particle intercepting film 22 and the bump electrode 8 have come into contact, the bump electrode 8 is damaged or broken down by a thermal stress attendant upon the operation of the semiconductor chip 21. Therefore, the alpha-particle intercepting film 22 and the bump electrode 8 are prevented from coming into contact.

The bump electrodes 8 are formed by substantially the same lift-off process as in the first embodiment described before. Since the alpha-particle intercepting film 22 is provided on the passivation film 21AB, the first resist film 18 for the lift-off process is formed on the alpha-particle intercepting film 22 as indicated by a dotted line in FIG. 24. The first resist film 18 is formed on the area where the bump electrodes 8 are not formed, namely, on each of the areas of the memory circuit portions RAM, the area of the logic circuit portion Logic and the areas of the peripheral circuits configured of the complementary MISFETs. The second resist film 19 (not shown) is formed on the first resist film 18 and the area where the bump electrodes 8 are formed. The first openings 20A are provided in the parts of the second resist film 19 corresponding to the bump electrodes 8 to be formed, and the second openings 20B are provided in the parts of the second resist film 19 overlying the first resist film 18. The bump electrodes 8 are formed in the first openings 20A, while dummy bump electrodes 8A are formed in the second openings 20B. By the next step, the bump electrodes 8 inside the first openings 20A are left behind, and the second resist film 19, the first resist film 18, and the dummy bump electrodes 8A inside the second openings 20B are removed. Thus, the semiconductor device of this embodiment is finished up.

In this manner, a method of manufacturing a semiconductor integrated circuit device wherein a mixed type semiconductor chip 21, in which a bipolar transistor Tr and complementary MISFETs coexist, is formed with a bump electrode 8 by a lift-off technique on a front surface of its area for forming the bipolar transistor Tr; comprises forming an alpha particle-intercepting film 22 on a front surface of an area of said semiconductor chip 21 for forming said complementary MISFETs, forming a first resist film 18 on said alpha particle-intercepting film 22, forming a second resist film 19 on the whole surface of said semiconductor chip 21 including said first resist film 18 and the bipolar transistor Tr-forming area, providing a first opening 20A for forming said bump electrode 8 in a bipolar transistor Tr-forming area of said second resist film 19 and also providing a second opening 20B for forming a dummy bump electrode 8A in a complementary MISFET-forming area of said second resist film 19, depositing a metal film 8B for forming said bump electrode 8 on the whole surface of said semiconductor chip 21 including the front surface of said semiconductor chip 21 inside said first opening 20A, said first resist film 18 inside said second opening 20B and said second resist film 19, and removing said second resist film 19 and said first resist film 18 respectively, so as to leave said metal film 8B inside said first opening 20A and form said bump electrode 8 and to remove said metal film 8B on said second resist film 19 and said metal film 8B (said dummy bump electrode 8A) on said first resist film 18, whereby said second opening 20B for forming said dummy bump electrode 8A is provided in said complementary MISFET-forming area, and a peeling solution is positively caused to permeate into said second resist film 19 through said second opening 20B, so that the stripping property of said complementary MISFET-forming area of said second resist film 19 where said bump electrode 8 is not formed can be enhanced.

In addition, owing to the formation of said alpha particle-intercepting film 22 on said complementary MISFET-forming area of said semiconductor chip 21, alpha particles from said dump electrode 8 are intercepted by said alpha particle-intercepting film 22, and the fluctuation of the threshold voltage of said complementary MISFET can be reduced, so that the degradation of the characteristic of said complementary MISFET with the lapse of time can be lessened.

Besides, owing to the fact that said alpha particle-intercepting film 22 and said bump electrode 8 are spaced, the damage or breakdown of said bump electrode 8 attributed to the difference between the coefficients of thermal expansion of said alpha particle-intercepting film 22 and said semiconductor chip 21 can be prevented, so that the electrical reliability of said semiconductor integrated circuit device can be enhanced.

Besides, owing to the fact that said alpha particle-intercepting film 22 formed of a polyimide resin is not formed on the area where said bump electrode 8 is formed, said bump electrode 8 can be worked independently without being affected by the poor workability of said alpha particle-intercepting film 22, so that the bump electrodes 8 can be formed more densely.

Further, a method of manufacturing a semiconductor integrated circuit device wherein a semiconductor chip 21 with a memory function, including a memory circuit portion RAM and a peripheral circuit is formed with a bump electrode 8 by a lift-off technique on a front surface of its area for forming the peripheral circuit; comprises forming an alpha particle-intercepting film 22 on a front surface of an area said semiconductor chip 21 for forming said memory circuit portion RAM, forming a first resist film 18 on said alpha particle-intercepting film 22, forming a second resist film 19 on the whole surface of said semiconductor chip 21 including said first resist film 18 and the peripheral circuit-forming area, providing a first opening 20A for forming said bump electrode 8 in a peripheral circuit-forming area of said second resist film 19 and also providing a second opening 20B for forming a dummy bump electrode 8A in an area of said second resist film 20B for forming said memory circuit portion RAM, depositing a metal film 8B for forming said bump electrode 8 on the whole surface of said semiconductor chip 21 including the front surface of said semiconductor chip 21 inside said first opening 20A, said first resist film 18 inside said second opening 20B and said second resist film 19, and removing said second resist film 19 and said first resist film 18 respectively, so as to leave said metal film 8B inside said first opening 20A and form said bump electrode 8 and to remove said metal film 8B on said second resist film 19 and said metal film 8B (said dummy bump electrode 8A) on said first resist film 18, whereby said second opening 20B for forming said dummy bump electrode 8A is provided in said area for forming said memory circuit portion RAM, and a peeling solution is positively caused to permeate into said second resist film 19 through said second opening 20B, so that the stripping property of the memory circuit portion RAM-forming area of said second resist film 19 where said bump electrode 8 is not formed can be enhanced.

In addition, owing to the formation of said alpha particle-intercepting film 22 on said memory circuit portion RAM-forming area of said semiconductor chip 21, alpha particles from said bump electrode 8 can be intercepted by said alpha particle-intercepting film 22, so that soft errors ascribable to the alpha particles can be reduced.

By the way, the present invention may well construct the memory circuit portion RAM of a DRAM.

Each of the memory cells of the DRAM is configured of an n-channel MISFET for selecting the memory cell, and an information storing capacitor which is connected in series with one semiconductor region of the MISFET.

Besides, the present invention may well provide the bump electrodes 8 on the internal terminals of the mounting board for carrying the semiconductor chips 21.

Now, there will be described still another embodiment in which the present invention is applied to a semiconductor integrated circuit device that has wiring principally made of Cu, formed on the front surface of the wiring substrate of a mother chip, a wiring board, a printed-wiring board or the like.

Figure 25:
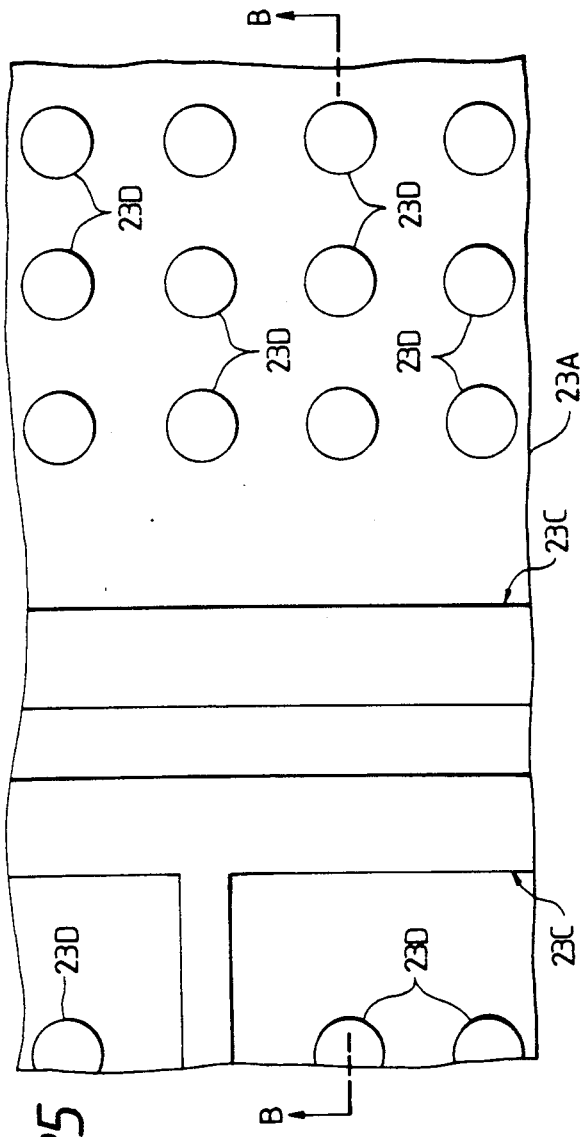
FIG. 25 is a plan view of essential portions illustrative of the lift-off process of a substrate constituting a semiconductor integrated circuit device which is still another embodiment of the present invention.
Figure 26:
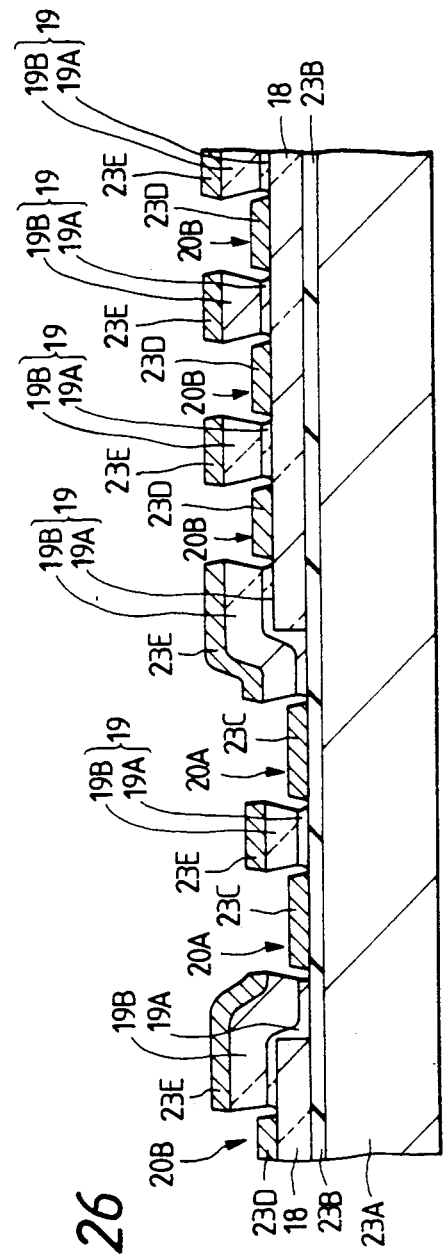
FIG. 26 is a sectional view of the substrate taken along cutting-plane line B—B in the plan view shown in FIG. 25.

The wiring substrate which constitutes the semiconductor integrated circuit device being the third embodiment of the present invention is shown in FIG. 25 (a plan view of the essential portions of a semiconductor device under a lift-off process) and FIG. 26 (a sectional view taken along cutting-plane line B—B indicated in the plan view of FIG. 25).

As shown in FIGS. 25 and 26, the wiring substrate 23A constituting the semiconductor integrated circuit device has wiring lines 23C extended with an inter-layer insulator film 23B interposed therebetween. The wiring substrate 23A is made of any of a silicon carbide substrate, a single-crystal silicon substrate, a ceramic substrate, an epoxy type resin substrate and a polyimide type resin substrate. The wiring 23C is constructed of Cu, an alloy containing Cu, or a composite film with a film of another metal stacked on Cu, which is formed by lift-off, that is, it is principally constructed of Cu. Although the element Cu can be processed by isotropic wet etching (chemical etching), it is difficult of anisotropic dry etching and cannot form wiring in a very fine shape. However, the wiring 23C principally made of Cu can be formed by the lift-off process.

The wiring 23C can be formed by substantially the same lift-off process as described before.

First, in areas where the wiring 23C is not formed, the first resist film 18 is formed on the wiring substrate 23A with the inter-layer insulator film 23B interposed therebetween.

Subsequently, the second resist film 19 is formed on an area where the wiring 23C is formed and on the first resist film 18 in the areas where the wiring 23C is not formed.

Subsequently, the first openings (grooves) 20A are provided in the second resist film 19 in the areas where the wiring 23C is formed, and the second openings 20B are provided in the second resist film 19 in the areas where the wiring 23C is not formed.

At the next step, a metal film 23E principally made of Cu is deposited on the whole surface of the wiring substrate 23A, so as to form the wiring lines 23C on the inter-layer insulator film 23B inside the first openings 20A, dummy wiring lines 23D on the first resist film 18 inside the second openings 20B, and the metal film 23E on the second resist film 19.

Next, the second resist film 19 and the first resist film 18 are respectively removed so as to leave the wiring lines 23C inside the first openings 20A and to remove the dummy wiring lines 23D on the first resist film 18 and the metal film 23E on the second resist film 19. It is needless to say that the second resist film 19 here can be formed as a single layer when the wiring 23 need not be formed thick.

Although the dummy wiring lines 23D are formed in a circular shape in plan in this third embodiment, they may well be formed in a square shape in plan in the present invention.

In this manner, a method of manufacturing a semiconductor integrated circuit device wherein wiring 23C principally made of Cu is formed on a front surface of a wiring substrate 23A; comprises forming a first resist film 18 on that area of the front surface of said wiring substrate 23A on which the wiring 23C is not formed, unlike an area for forming said wiring 23C, forming a second resist film 19 on the whole surface of said wiring substrate 23A including said first resist film 18 and said area for forming said wiring 23C, providing a first opening 20A for forming said wiring 23C in that area of said second resist film 19 in which said wiring 23C is not formed and also providing a second opening 20B for forming dummy wiring 23D in that area of said second resist film 19 in which said wiring 23C is not formed, depositing a metal film 23E for forming said wiring 23C on the whole surface of said wiring substrate 23A including the front surface of said wiring substrate 23A inside said first opening 20A, said first resist film 18 inside said second opening 20B and said second resist film 19, and removing said second resist film 19 and said first resist film 18 respectively, so as to leave said metal film 23E inside said first opening 20A and form said wiring 23C and to remove said metal film 23E on said second resist film 19 and said dummy wiring 23D on said first resist film 18, whereby said wiring 23C principally made of Cu can be formed at a precision corresponding to the fabricated dimension of said first opening 20A of said second resist film 19, on the basis of the lift-off technique, so that said wiring 23C of very fine dimension can be formed without using a dry process, and besides, said second opening 20B for forming said dummy wiring 23D is formed in said area in which said wiring 23C is not formed, and a peeling solution is positively caused to permeate into said second resist film 19 through said second opening 20B, so that the stripping property of said second resist film 19 in said area in which said wiring 23C is not formed can be enhanced.

Although, in the above, the invention made by the inventor has been concretely described in conjunction with the embodiments, it is a matter of course that the present invention is not restricted to the foregoing embodiments but that it can be variously modified within a scope not departing from the purport thereof.

By way of example, the present invention is not restricted only to wiring principally made of Cu, but it is also applicable to a case where aluminum wiring is formed in an area of greatly different wiring densities.

In addition, the present invention is applicable to a semiconductor integrated circuit device in which a semiconductor chip mainly configured of MISFETs is mounted.

Typical aspects of performance of the present invention are briefly summarized as follows:

In a semiconductor integrated circuit device employing a lift-off technique, the stripping property of a resist film in an area where a conductor film is not formed can be enhanced.

Moreover, the number of steps for stripping off the resist film can be decreased.

Further, in a semiconductor integrated circuit device wherein a semiconductor chip having a memory function is formed with a bump electrode by a liftoff technique, the stripping property of a resist film in a memory circuit portion-forming area where the bump electrode is not formed can be enhanced.

Moreover, soft errors ascribable to alpha particles can be reduced in the memory circuit portion.

Still further, in a semiconductor integrated circuit device wherein wiring principally made of Cu is formed on the front surface of a wiring substrate, the wiring can be formed into very fine dimensions by a lift-off process, and the stripping property of a resist film in an area where the wiring is not formed, during the lift-off process can be enhanced.

What is claimed is:

1. A semiconductor integrated circuit device, comprising:
   a memory cell array portion on a semiconductor substrate, and including a plurality of memory cells arranged in the shape of a matrix;
   a peripheral circuit portion including a plurality of transistors on said semiconductor substrate;
   a plurality of external terminals on said semiconductor substrate; and
   a plurality of bump electrodes each connected to each of said plurality of external terminals, wherein said plurality of external terminals are at a portion of said semiconductor substrate other than at said memory cell array portion.

2. A semiconductor integrated circuit device according to claim 1, wherein said bump electrodes include a radioactive element.

3. A semiconductor integrated circuit device according to claim 1, wherein said bump electrodes are comprised of solder.

4. A semiconductor integrated circuit device according to claim 1, wherein said plurality of external terminals are on said peripheral circuit portion of said semiconductor substrate.

5. A semiconductor integrated circuit device according to claim 4, wherein said peripheral circuit portion of said semiconductor substrate includes an input circuit and an output circuit, a power source circuit, an address buffer circuit and X, Y-driver circuits.

6. A semiconductor integrated circuit device according to claim 1, wherein each of said memory cells comprises a driving transistor and a resistor element coupled in series with one another.

7. A semiconductor integrated circuit device according to claim 6, wherein said peripheral circuit portion of said semiconductor substrate comprises p-channel and n-channel MISFETs and a bipolar transistor.

8. A semiconductor integrated circuit device, comprising:
   a memory cell array portion on a semiconductor substrate, and including a plurality of memory cells arranged in the shape of a matrix;
   a peripheral circuit portion including a plurality of transistors on said semiconductor substrate;
   a plurality of first external terminals on said semiconductor substrate;
   a substrate having wirings and a plurality of second external terminals, thereon;
   a plurality of bump electrodes each electrically connecting wirings on said substrate to each of said plurality of first external terminals;
   a body for encapsulating said semiconductor substrate and said substrate;
   a plurality of leads protruding from said body; and
   means for connecting said second external terminals to said plurality of leads, wherein said plurality of bump electrodes are at a portion of said semiconductor substrate other than at said memory cell array portion.

9. A semiconductor integrated circuit device according to claim 8, wherein said substrate comprises a semiconductor substrate.

10. A semiconductor integrated circuit device according to claim 8, wherein each of said memory cells comprises a driving transistor and a resistive element coupled in series with one another.

11. A semiconductor integrated circuit device according to claim 10, wherein said peripheral circuit portion of said semiconductor substrate comprises p-channel and n-channel MISFETs and a bipolar transistor.

12. A semiconductor integrated circuit device according to claim 8, wherein said bump electrodes include a radioactive element.

13. A semiconductor integrated circuit device according to claim 8, wherein said bump electrodes are each comprised of solder.

14. A semiconductor integrated circuit device according to claim 8, wherein said first external terminals are on said peripheral circuit portion of said semiconductor substrate.

15. A semiconductor integrated circuit device according to claim 3, wherein said solder comprises Pb and Sn.

16. A semiconductor integrated circuit device according to claim 13, wherein said solder comprises Pb and Sn.

* * * * *